(12) United States Patent
Rathburn

(10) Patent No.: US 9,350,124 B2
(45) Date of Patent: May 24, 2016

(54) HIGH SPEED CIRCUIT ASSEMBLY WITH INTEGRAL TERMINAL AND MATING BIAS LOADING ELECTRICAL CONNECTOR ASSEMBLY

(71) Applicant: HSIO TECHNOLOGIES, LLC, Maple Grove, MN (US)

(72) Inventor: James Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 0 days.

(21) Appl. No.: 14/408,039

(22) PCT Filed: Mar. 13, 2013

(86) PCT No.: PCT/US2013/030981
§ 371 (c)(1),
(2) Date: Dec. 15, 2014

(87) PCT Pub. No.: WO2014/011228
PCT Pub. Date: Jan. 16, 2014

(65) Prior Publication Data
US 2015/0136467 A1 May 21, 2015

Related U.S. Application Data

(63) Continuation-in-part of application No. 13/879,883, filed as application No. PCT/US2011/062313 on Nov.
(Continued)

(51) Int. Cl.
*H01R 12/68* (2011.01)
*H01R 12/50* (2011.01)
(Continued)

(52) U.S. Cl.
CPC ............ *H01R 23/6813* (2013.01); *H01R 12/82* (2013.01); *H01R 13/2457* (2013.01);
(Continued)

(58) Field of Classification Search
CPC . H01R 23/6813; H01R 13/2457; H01R 12/82
See application file for complete search history.

(56) References Cited

U.S. PATENT DOCUMENTS

| | | | |
|---|---|---|---|
| 3,672,986 | A | 6/1972 | Schneble, Jr. et al. |
| 4,188,438 | A | 2/1980 | Burns |

(Continued)

FOREIGN PATENT DOCUMENTS

| | | |
|---|---|---|
| JP | 2003/217774 | 7/2003 |
| WO | WO 91/14015 | 9/1991 |

(Continued)

OTHER PUBLICATIONS

Notification of Transmittal of the International Search Report and the Written Opinion of the International Searching Authority mailed Jul. 30, 2010 in International Application No. PCT/US2010/036043.
(Continued)

*Primary Examiner* — James Harvey

(57) ABSTRACT

A method of making an array of integral terminals on a circuit assembly. The method includes the steps of depositing at least a first liquid dielectric layer on the first surface of a first circuit member, imaged to include a plurality of first recesses corresponding to the array of integral terminals. The selected surfaces of the first recesses are processed to accept electro-less conductive plating deposition. Electro-lessly plating is applied to the selected surfaces of the first recesses to create a plurality of first conductive structures electrically coupled to, and extending generally perpendicular to, the first circuitry layer. Electro-plating is applied to the electro-less plating to substantially first recesses with a conductive material. The steps of depositing, processing, electro-less plating, and electro-plating are repeated to form the integral terminals of a desired shape. The dielectric layers are removed to expose the terminals.

19 Claims, 27 Drawing Sheets

Related U.S. Application Data 29, 2011, now Pat. No. 9,093,767, application No. 14/408,039, which is a continuation-in-part of application No. 13/418,853, filed on Mar. 13, 2012, now Pat. No. 9,196,980.

(60) Provisional application No. 61/669,893, filed on Jul. 10, 2012, provisional application No. 61/418,625, filed on Dec. 1, 2010, provisional application No. 61/452,875, filed on Mar. 15, 2011.

(51) Int. Cl.
| | | |
|---|---|---|
| *H01R 13/24* | (2006.01) | |
| *H01R 12/82* | (2011.01) | |
| *H05K 3/36* | (2006.01) | |
| *H05K 3/40* | (2006.01) | |
| H01R 12/73 | (2011.01) | |
| H01L 23/00 | (2006.01) | |
| H05K 1/09 | (2006.01) | |
| H05K 1/11 | (2006.01) | |
| H05K 1/18 | (2006.01) | |
| H05K 3/00 | (2006.01) | |
| H05K 3/42 | (2006.01) | |
| H05K 3/46 | (2006.01) | |

(52) U.S. Cl.
CPC .......... *H05K3/363* (2013.01); *H05K 3/365* (2013.01); *H05K 3/4007* (2013.01); *H05K 3/4015* (2013.01); *H01L 24/16* (2013.01); *H01L 24/48* (2013.01); *H01L 2224/16225* (2013.01); *H01L 2224/48091* (2013.01); *H01L 2924/00014* (2013.01); *H01L 2924/12042* (2013.01); *H01L 2924/15311* (2013.01); *H01R 12/73* (2013.01); *H05K 1/092* (2013.01); *H05K 1/111* (2013.01); *H05K 1/182* (2013.01); *H05K 3/0094* (2013.01); *H05K 3/425* (2013.01); *H05K 3/4694* (2013.01); *H05K 2201/0397* (2013.01); *H05K 2201/048* (2013.01); *H05K 2201/09381* (2013.01); *H05K 2201/09545* (2013.01); *H05K 2201/09563* (2013.01); *H05K 2201/09854* (2013.01); *H05K 2201/10378* (2013.01); *H05K 2201/10386* (2013.01); *H05K 2201/209* (2013.01); *H05K 2201/2072* (2013.01); *H05K 2203/1476* (2013.01)

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,059,128 A * | 10/1991 | Murphy .......... H01R 12/82 439/161 |
| 5,071,363 A | 12/1991 | Reylek et al. |
| 5,072,520 A | 12/1991 | Nelson |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno et al. |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh et al. |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert et al. |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey et al. |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert et al. |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |

(56) References Cited

U.S. PATENT DOCUMENTS

| | | |
|---|---|---|
| 6,750,473 B2 | 6/2004 | Amundson |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhaus et al. |
| 6,856,151 B1 | 2/2005 | Cram |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert et al. |
| 6,971,902 B2 | 12/2005 | Taylor et al. |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn et al. |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,927,109 B1* | 4/2011 | Gattuso ............... H01R 13/052 439/66 |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 9,184,527 B2* | 11/2015 | Rathburn ............... H01R 13/24 |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0077923 A1* | 4/2003 | Matsuo ............... H01R 12/777 439/67 |
| 2003/0096512 A1 | 5/2003 | Cornell |

(56) References Cited

U.S. PATENT DOCUMENTS

| | | |
|---|---|---|
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2004/0253875 A1 * | 12/2004 | Brown .................... H01L 24/72 439/620.14 |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson et al. |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0265919 A1 | 11/2006 | Huang |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0300734 A1 | 12/2010 | Ables et al. |
| 2011/0076862 A1 * | 3/2011 | Yeh .................... H01R 13/2457 439/70 |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2015/0013901 A1 | 1/2015 | Rathburn |
| 2015/0091600 A1 | 4/2015 | Rathburn |
| 2015/0136467 A1 * | 5/2015 | Rathburn ................ H05K 3/363 174/261 |

(56) References Cited

U.S. PATENT DOCUMENTS

2015/0162678 A1 6/2015 Rathburn
2015/0181710 A1 6/2015 Rathburn

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO-2015/006393 | 1/2015 |

OTHER PUBLICATIONS

Notification of Transmittal of the International Search Report and the Written Opinion of the International Searching Authority mailed Jul. 21, 2010 in International Application No. PCT/US2010/036047.
Notification of Transmittal of the International Search Report and the Written Opinion of the International Searching Authority mailed Jul. 28, 2010 in International Application No. PCT/US2010/036363.
Notification of Transmittal of the International Search Report and the Written Opinion of the International Searching Authority mailed Jul. 28, 2010 in International Application No. PCT/US2010/036377.
Notification of Transmittal of the International Search Report and the Written Opinion of the International Searching Authority mailed Jul. 30, 2010 in International Application No. PCT/US2010/036388.
Notification of Transmittal of the International Search Report and the Written Opinion of the International Searching Authority mailed Jul. 27, 2010 in International Application No. PCT/US2010/036397.
Notification of Transmittal of the International Search Report and the Written Opinion of the International Searching Authority mailed Jul. 30, 2010 in International Application No. PCT/US2010/036055.
Notification of Transmittal of the International Search Report and the Written Opinion of the International Searching Authority mailed Aug. 4, 2010 in International Application No. PCT/US2010/036288.
Notification of Transmittal of the International Search Report and the Written Opinion of the International Searching Authority mailed Aug. 4, 2010 in International Application No. PCT/US2010/036285.
Notification of Transmittal of the International Search Report and the Written Opinion of the International Searching Authority mailed Jul. 30, 2010 in International Application No. PCT/US2010/036282.
Notification of Transmittal of the International Search Report and the Written Opinion of the International Searching Authority mailed Jul. 30, 2010 in International Application No. PCT/US2010/036295.
Notification of Transmittal of the International Search Report and the Written Opinion of the International Searching Authority mailed Jul. 30, 2010 in International Application No. PCT/US2010/036313.
Notification of Transmittal of the International Search Report and the Written Opinion of the International Searching Authority mailed Aug. 3, 2010 in International Application No. PCT/US2010/037619.
Notification of Transmittal of the International Search Report and the Written Opinion of the International Searching Authority mailed Sep. 7, 2010 in International Application No. PCT/US2010/038600.
Notification of Transmittal of the International Search Report and the Written Opinion of the International Searching Authority mailed Aug. 18, 2010 in International Application No. PCT/US2010/038606.
Notification of Transmittal of the International Search Report and the Written Opinion of the International Searching Authority mailed Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority mailed Apr. 14, 2011 in International Application No. PCT/US2011/023138.
Notification of Transmittal of the International Search Report and the Written Opinion of the International Searching Authority mailed Aug. 17, 2011 in International Application No. PCT/US2011/033726.
Notification of Transmittal of the International Search Report and the Written Opinion of the International Searching Authority mailed Sep. 27, 2011 in International Application No. PCT/US2011/038845.
Notification of Transmittal of the International Search Report and the Written Opinion of the International Searching Authority mailed Feb. 8, 2012 in International Application No. PCT/US2011/056664.
Notification of Transmittal of the International Search Report and the Written Opinion of the International Searching Authority mailed Mar. 26, 2012 in International Application No. PCT/US2011/062313.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Notification of Transmittal of the International Search Report and the Written Opinion of the International Searching Authority mailed Jun. 3, 2013 in International Application No. PCT/US2013/031395.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Print—Definition of Print by The Free Dictionary, http://www.thefreedictionary.com/print, Aug. 13, 2014.

(56) References Cited

OTHER PUBLICATIONS

Restriction Requirement mailed Jun. 13, 2013 in co-pending U.S. Appl. No. 13/266,486, now published as US Patent Application Publication No. US 2012/0055701.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Final Office Action mailed May 15, 2014 in co-pending U.S. Appl. No. 13/266,486, now published as US Patent Application Publication No. US 2012/0055701.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Ex Parte Quayle Action mailed Oct. 1, 2014 in co-pending U.S. Appl. No. 13/266,486, now published as US Patent Application Publication No. US 2012/0055701.
Amendment and Response After ExParte Quayle Action filed Oct. 6, 2014 in co-pending U.S. Appl. No. 13/266,486, now published as US Patent Application Publication No. US 2012/0055701.
Notice of Non-Compliant Amendment mailed Oct. 14, 2014 in co-pending U.S. Appl. No. 13/266,486, now published as US Patent Application Publication No. US 2012/0055701.
Corrected Amendment and Response filed Oct. 15, 2014 in co-pending U.S. Appl. No. 13/266,486, now published as US Patent Application Publication No. US 2012/0055701.
Notice of Allowance and Fee(s) Due mailed Nov. 24, 2014 in co-pending U.S. Appl. No. 13/266,486, now published as US Patent Application Publication No. US 2012/0055701.
Supplemental Notice of Allowance mailed Dec. 24, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now issued as U.S. Pat. No. 8,803,539.
Restriction Requirement mailed Oct. 1, 2013 in co-pending U.S. Appl. No. 13/319,145, now published as US Patent Application Publication No. 2012/0049342.
Response to Restriction Requirement filed Oct. 4, 2013 in co-pending U.S. Appl. No. 13/319,145, now published as US Patent Application Publication No. 2012/0049342.
Office Action mailed Dec. 26, 2013 in co-pending U.S. Appl. No. 13/319,145, now published as US Patent Application Publication No. 2012/0049342.
Amendment and Response filed Mar. 18, 2014 in co-pending U.S. Appl. No. 13/319,145, now published as US Patent Application Publication No. 2012/0049342.
Final Office Action mailed Aug. 4, 2014 in co-pending U.S. Appl. No. 13/319,145, now published as US Patent Application Publication No. 2012/0049342.
Applicant-Initiated Interview Summary mailed Sep. 12, 2014 in co-pending U.S. Appl. No. 13/319,145 now published as US Patent Application Publication No. US 2012/0049342.
Amendment and Response Under Rule 1.116 filed Sep. 18, 2014 in co-pending U.S. Appl. No. 13/319,145 now published as US Patent Application Publication No. US 2012/0049342.
Notice of Allowance and Fee(s) Due mailed Dec. 19, 2014 in co-pending U.S. Appl. No. 13/319,145 now published as US Patent Application Publication No. US 2012/0049342.
Office Action mailed Nov. 22, 2013 in co-pending U.S. Appl. No. 13/266,907, now issued as U.S. Pat. No. 8,928,344.
Amendment and Response filed Jan. 3, 2014 in co-pending U.S. Appl. No. 13/266,907, now issued as U.S. Pat. No. 8,928,344.
Supplemental Amendment and Response filed Jan. 29, 2014 in co-pending U.S. Appl. No. 13/266,907, now issued as U.S. Pat. No. 8,928,344.
Final Office Action mailed May 7, 2014 in co-pending U.S. Appl. No. 13/266,907, now issued as U.S. Pat. No. 8,928,344.
Amendment and Response Under Rule 1.116 mailed Jul. 10, 2014 in co-pending U.S. Appl. No. 13/266,907, now issued as U.S. Pat. No. 8,928,344.
Advisory Action mailed Jul. 25, 2014 in co-pending U.S. Appl. No. 13/266,907, now issued as U.S. Pat. No. 8,928,344.
Advisory Action mailed Aug. 8, 2014 in co-pending U.S. Appl. No. 13/266,907, now issued as U.S. Pat. No. 8,928,344.
Amendment and Response to Final Office Action and RCE filed Aug. 26, 2014 in co-pending U.S. Appl. No. 13/266,907, now issued as U.S. Pat. No. 8,928,344.
Notice of Allowance and Fee(s) Due mailed Oct. 8, 2014 in co-pending U.S. Appl. No. 13/266,907, now issued as U.S. Pat. No. 8,928,344.
Office Action mailed Jan. 3, 2014 in co-pending U.S. Appl. No. 13/318,038, now issued as U.S. Pat. No. 8,912,812.
Amendment and Response and Terminal Disclaimer filed Apr. 2, 2014 in co-pending U.S. Appl. No. 13/318,038, now issued as U.S. Pat. No. 8,912,812.
Terminal Disclaimer Review Decision mailed Apr. 2, 2014 in co-pending U.S. Appl. No. 13/318,038, now issued as U.S. Pat. No. 8,912,812.
Final Office Action mailed Aug. 1, 2014 in co-pending U.S. Appl. No. 13/318,038, now issued as U.S. Pat. No. 8,912,812.
Amendment and Response Under Rule 1.116 and Termination Disclaimer filed Sep. 4, 2014 in co-pending U.S. Appl. No. 13/318,038, now issued as U.S. Pat. No. 8,912,812.
Terminal Disclaimer Review Decision mailed Sep. 8, 2014 in co-pending U.S. Appl. No. 13/318,038, now issued as U.S. Pat. No. 8,912,812.
Notice of Allowance and Fee(s) Due mailed Sep. 30, 2014 in co-pending U.S. Appl. No. 13/318,038, now issued as U.S. Pat. No. 8,912,812.
Restriction Requirement mailed Dec. 9, 2013 in co-pending U.S. Appl. No. 13/318,171, now issued as U.S. Pat. No. 8,789,272.
Response to Restriction Requirement filed Dec. 17, 2013 in co-pending U.S. Appl. No. 13/318,171, now issued as U.S. Pat. No. 8,789,272.
Office Action mailed Feb. 14, 2014 in co-pending U.S. Appl. No. 13/318,171, now issued as U.S. Pat. No. 8,789,272.
Amendment and Response filed Feb. 26, 2014 in co-pending U.S. Appl. No. 13/318,171, now issued as U.S. Pat. No. 8,789,272.
Notice of Allowance and Fee(s) Due mailed Mar. 14, 2014 in co-pending U.S. Appl. No. 13/318,171, now issued as U.S. Pat. No. 8,789,272.
Restriction Requirement mailed Dec. 9, 2013 in co-pending U.S. Appl. No. 13/318,181, now published as US Patent Application Publication No. US 2012/0044659.
Response to Restriction Requirement filed Jan. 28, 2014 in co-pending U.S. Appl. No. 13/318,181, now published as US Patent Application Publication No. US 2012/0044659.

(56) References Cited

OTHER PUBLICATIONS

Office Action mailed Apr. 21, 2014 in co-pending U.S. Appl. No. 13/318,181, now published as US Patent Application Publication No. US 2012/0044659.
Amendment and Response filed Jul. 27, 2014 in co-pending U.S. Appl. No. 13/318,181, now published as US Patent Application Publication No. US 2012/0044659.
Notice of Allowance and Fee(s) Due mailed Oct. 24, 2014 in co-pending U.S. Appl. No. 13/318,181, now published as US Patent Application Publication No. US 2012/0044659.
Supplemental Notice of Allowance mailed Dec. 19, 2014 in co-pending U.S. Appl. No. 13/318,181, now published as US Patent Application Publication No. US 2012/0044659.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 2013 in co-pending U.S. Appl. No. 13/318,200, now published as US Patent Application Publication No. US 2012/0056332.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Office Action mailed Nov. 19, 2014 in co-pending U.S. Appl. No. 13/318,200, now published as US Patent Application Publication No. US 2012/0056332.
Office Action mailed Nov. 23, 2012 in co-pending U.S. Appl. No. 13/318,263, now published as US Patent Application Publication No. US 2012/0043667.
Amendment and Response filed Mar. 4, 2013 in co-pending U.S. Appl. No. 13/318,263, now published as US Patent Application Publication No. US 2012/0043667.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
RCE filed Mar. 10, 2014 in co-pending U.S. Appl. No. 13/320,285, now published as US Patent Application Publication No. US 2012/0055702.
Office Action mailed Jul. 29, 2014 in co-pending U.S. Appl. No. 13/320,285, now published as US Patent Application Publication No. US 2012/0055702.
Amendment and Response and Examiner's Interview Summary filed Oct. 15, 2014 in co-pending U.S. Appl. No. 13/320,285, now published as US Patent Application Publication No. US 2012/0055702.
Restriction Requirement mailed Sep. 8, 2014 in co-pending U.S. Appl. No. 13/318,369, now published as US Patent Application Publication No. US 2012/0043119.
Response to Restriction Requirement filed Oct. 13, 2014 in co-pending U.S. Appl. No. 13/318,369, now published as US Patent Application Publication No. US 2012/0043119.
Office Action mailed Nov. 14, 2014 in co-pending U.S. Appl. No. 13/318,369, now published as US Patent Application Publication No. US 2012/0043119.
Office Action mailed Aug. 26, 2014 in co-pending U.S. Appl. No. 13/318,382, now published as US Patent Application Publication No. US 2012/0043130.
Amendment and Response and Terminal Disclaimer filed Nov. 14, 2014 in co-pending U.S. Appl. No. 13/318,382, now published as US Patent Application Publication No. US 2012/0043130.
Restriction Requirement mailed Sep. 26, 2013 in co-pending U.S. Appl. No. 13/319,120 now published as US Patent Application Publication No. US 2012/0061851.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Jan. 17, 2014 in co-pending U.S. Appl. No. 13/319,120 now published as US Patent Application Publication No. US 2012/0061851.
Amendment and Response filed Apr. 16, 2014 in co-pending U.S. Appl. No. 13/319,120 now published as US Patent Application Publication No. US 2012/0061851.
Final Office Action mailed Jul. 31, 2014 in co-pending U.S. Appl. No. 13/319,120 now published as US Patent Application Publication No. US 2012/0061851.
Applicant-Initiated Interview Summary mailed Sep. 12, 2014 in co-pending U.S. Appl. No. 13/319,120 now published as US Patent Application Publication No. US 2012/0061851.
Amendment and Response and RCE filed Oct. 1, 2014 in co-pending U.S. Appl. No. 13/319,120 now published as US Patent Application Publication No. US 2012/0061851.
Notice of Allowance and Fee(s) Due mailed Oct. 27, 2014 in co-pending U.S. Appl. No. 13/319,120 now published as US Patent Application Publication No. US 2012/0061851.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Jun. 27, 2014 in co-pending U.S. Appl. No. 13/319,158, now published as US Patent Application Publication No. 2012/0051016.
Amendment and Response filed Sep. 3, 2014 in co-pending U.S. Appl. No. 13/319,158, now published as US Patent Application Publication No. 2012/0051016.

(56) References Cited

OTHER PUBLICATIONS

Final Office Action mailed Nov. 6, 2014 in co-pending U.S. Appl. No. 13/319,158, now published as US Patent Application Publication No. 2012/0051016.
Amendment and Response Under Rule 1.116 and Request After Final Consideration Program 2.0 filed Dec. 18, 2014 in co-pending U.S. Appl. No. 13/319,158, now published as US Patent Application Publication No. 2012/0051016.
Advisory Action mailed Jan. 2, 2015 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Amendment and Response filed Jun. 10, 2014 in co-pending U.S. Appl. No. 13/319,203, now published as US Patent Application Publication No. 2012/0056640.
Final Office Action mailed Aug. 20, 2014 in co-pending U.S. Appl. No. 13/319,203, now published as US Patent Application Publication No. 2012/0056640.
Amendment and Response Under Rule 1.116 filed Oct. 2, 2014 in co-pending U.S. Appl. No. 13/319,203, now published as US Patent Application Publication No. 2012/0056640.
Applicant-Initiated Interview Summary mailed Oct. 9, 2014 in co-pending U.S. Appl. No. 13/319,203, now published as US Patent Application Publication No. 2012/0056640.
Advisory Action mailed Oct. 16, 2014 in co-pending U.S. Appl. No. 13/319,203, now published as US Patent Application Publication No. 2012/0056640.
Request for Continued Examination filed Nov. 12, 2014 in co-pending U.S. Appl. No. 13/319,203, now published as US Patent Application Publication No. 2012/0056640.
Notice of Allowance and Fee(s) Due mailed Dec. 10, 2014 in co-pending U.S. Appl. No. 13/319,203, now published as US Patent Application Publication No. 2012/0056640.
Response to Restriction Requirement filed Oct. 4, 2013 in co-pending U.S. Appl. No. 13/266,573, now published as US Patent Application Publication No. 2012/0061846.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Office Action mailed Jul. 3, 2014 in co-pending U.S. Appl. No. 13/266,573, now published as US Patent Application Publication No. 2012/0061846.
Amendment and Response filed Sep. 9, 2014 in co-pending U.S. Appl. No. 13/266,573, now published as US Patent Application Publication No. 2012/0061846.
Examiner-Initiated Interview Summary mailed Mar. 14, 2013 in co-pending U.S. Appl. No. 13/319,228, now published as US Patent Application Publication No. US 2012/0058653.
Restriction Requirement mailed Apr. 23, 2014 in co-pending U.S. Appl. No. 13/319,228, now published as US Patent Application Publication No. US 2012/0058653.
Response to Restriction Requirement filed Jun. 23, 2014 in co-pending U.S. Appl. No. 13/319,228, now published as US Patent Application Publication No. US 2012/0058653.
Office Action mailed Sep. 4, 2014 in co-pending U.S. Appl. No. 13/319,228, now published as US Patent Application Publication No. US 2012/0058653.
Amendment and Response and Terminal Disclaimer filed Nov. 17, 2014 in co-pending U.S. Appl. No. 13/319,228, now published as US Patent Application Publication No. US 2012/0058653.
Notice of Allowance and Fee(s) Due mailed Jan. 13, 2015 in co-pending U.S. Appl. No. 13/319,228, now published as US Patent Application Publication No. US 2012/0058653.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Abandonment mailed Oct. 10, 2014 in co-pending U.S. Appl. No. 13/575,368, now published as US Patent Application Publication No. 2013/0203273.
Office Action mailed Sep. 17, 2014 in co-pending U.S. Appl. No. 13/643,436, now published as US Patent Application Publication No. 2013/0105984.
Amendment and Response filed Nov. 19, 2014 in co-pending U.S. Appl. No. 13/643,436, now published as US Patent Application Publication No. 2013/0105984.
Office Action mailed Apr. 24, 2014 in co-pending U.S. Appl. No. 13/700,639, now published as US Patent Application Publication No. 2013/0078860.
Amendment and Response filed Jul. 30, 2014 in co-pending U.S. Appl. No. 13/700,639, now published as US Patent Application Publication No. 2013/0078860.
Final Office Action mailed Sep. 8, 2014 in co-pending U.S. Appl. No. 13/700,639, now published as US Patent Application Publication No. 2013/0078860.
Response Under Rule 1.116 filed Nov. 11, 2014 in co-pending U.S. Appl. No. 13/700,639, now published as US Patent Application Publication No. 2013/0078860.
Advisory Action mailed Dec. 3, 2014 in co-pending U.S. Appl. No. 13/700,639, now published as US Patent Application Publication No. 2013/0078860.
Amendment and Response and RCE filed Dec. 30, 2014 in co-pending U.S. Appl. No. 13/700,639, now published as US Patent Application Publication No. 2013/0078860.
Restriction Requirement mailed Jun. 5, 2014 in co-pending U.S. Appl. No. 13/879,783, now published as US Patent Application Publication No. 2013/0223034.
Response to Restriction Requirement filed Jul. 17, 2014 in co-pending U.S. Appl. No. 13/879,783, now published as US Patent Application Publication No. 2013/0223034.
Office Action mailed Oct. 6, 2014 in co-pending U.S. Appl. No. 13/879,783, now published as US Patent Application Publication No. 2013/0223034.
Office Action mailed Nov. 17, 2014 in co-pending U.S. Appl. No. 13/879,883, now published as US Patent Application Publication No. 2013/0244490.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Dec. 16, 2013 in co-pending U.S. Appl. No. 13/410,914, now published as US Patent Application Publication No. US 2012/0164888.
Amendment and Response filed Mar. 17, 2014 in co-pending U.S. Appl. No. 13/410,914, now published as US Patent Application Publication No. US 2012/0164888.
Final Office Action mailed Jun. 4, 2014 in co-pending U.S. Appl. No. 13/410,914, now published as US Patent Application Publication No. US 2012/0164888.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Amendment and Response and RCE filed Sep. 30, 2014 in co-pending U.S. Appl. No. 13/410,914, now published as US Patent Application Publication No. US 2012/0164888.

(56) References Cited

OTHER PUBLICATIONS

Office Action mailed Dec. 26, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Notice of Allowance and Fee(s) Due mailed Feb. 26, 2014 in co-pending U.S. Appl. No. 13/412,870, now published as US Patent Application Publication No. US 2012/0171907.
Restriction Requirement mailed Nov. 19, 2014 in co-pending U.S. Appl. No. 13/413,032, now published as US Patent Application Publication No. US 2012/0182035.
Response to Restriction Requirement filed Nov. 20, 2014 in co-pending U.S. Appl. No. 13/413,032, now published as US Patent Application Publication No. US 2012/0182035.
Notice of Allowance and Fee(s) Due mailed Jan. 5, 2015 in co-pending U.S. Appl. No. 13/413,032, now published as US Patent Application Publication No. US 2012/0182035.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed Sep. 16, 2013 in co-pending U.S. Appl. No. 13/413,724, now published as US Patent Application Publication No. US 2012/0168948.
Amendment and Response filed Nov. 20, 2013 in co-pending U.S. Appl. No. 13/413,724, now published as US Patent Application Publication No. US 2012/0168948.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Notice of Allowance and Fee(s) Due mailed May 9, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.

Amendment and Response filed Aug. 26, 2014 in co-pending U.S. Appl. No. 13/418,853, now published as US Patent Application Publication No. US 2012/0244728.
Final Office Action mailed Oct. 28, 2014 in co-pending U.S. Appl. No. 13/418,853, now published as US Patent Application Publication No. US 2012/0244728.
Notice of Allowance and Fee(s) Due mailed Oct. 2, 2013 in co-pending U.S. Appl. No. 13/448,865, now published as US Patent Application Publication No. US 2012/0199985.
Notice of Allowance and Fee(s) Due mailed Dec. 6, 2013 in co-pending U.S. Appl. No. 14/058,863, now published as US Patent Application Publication No. 2014/0043782.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notice of Allowance and Fee(s) Due mailed Jul. 28, 2013 in co-pending U.S. Appl. No. 13/448,914, now published as US Patent Application Publication No. US 2012/0202364.
Office Action mailed Oct. 7, 2013 in co-pending U.S. Appl. No. 13/969,953, now issued as U.S. Pat. No. 8,704,377.
Amendment and Response and Terminal Disclaimer filed Nov. 20, 2013 in co-pending U.S. Appl. No. 13/969,953, now issued as U.S. Pat. No. 8,704,377.
Final Office Action mailed Dec. 20, 2013 in co-pending U.S. Appl. No. 13/969,953, now issued as U.S. Pat. No. 8,704,377.
Amendment and Response to Final Office filed Dec. 30, 2013 in co-pending U.S. Appl. No. 13/969,953, now issued as U.S. Pat. No. 8,704,377.
Notice of Allowance and Fee(s) Due mailed Jan. 22, 2014 in co-pending U.S. Appl. No. 13/969,953, now issued as U.S. Pat. No. 8,704,377.
Co-pending U.S. Appl. No. 14/327,916 titled Matrix Defined Electrical Circuit Structure, filed Jul. 10, 2014.
Co-pending U.S. Appl. No. 14/408,205 titled Hybrid Printed Circuit Assembly With Low Density Main Core and Embedded High Density Circuit Regions, filed Dec. 15, 2014.
Co-pending U.S. Appl. No. 14/408,338 titled Semiconductor Socket With Direct Selective Metalization, filed Dec. 16, 2014.
Co-pending U.S. Appl. No. 14/565,724 titled Performance Enhanced Semiconductor Socket, filed Dec. 10, 2014.
Final Office Action mailed Mar. 16, 2015 in co-pending U.S. Appl. No. 13/320,285, now published as US Patent Application Publication No. US 2012/0055702.
Final Office Action mailed Feb. 10, 2015 in co-pending U.S. Appl. No. 13/318,382, now published as US Patent Application Publication No. US 2012/0043130.
Amendment and Response with RCE filed Feb. 5, 2015 in co-pending U.S. Appl. No. 13/319,158, now published as US Patent Application Publication No. 2012/0051016.
Notice of Allowance and Fee(s) Due mailed Feb. 9, 2015 in co-pending U.S. Appl. No. 13/643,436, now published as US Patent Application Publication No. 2013/0105984.
Restriction Requirement mailed Feb. 12, 2015 in co-pending U.S. Appl. No. 13/700,639, now published as US Patent Application Publication No. 2013/0078860.
Response to Restriction Requirement filed Feb. 24, 2015 in co-pending U.S. Appl. No. 13/700,639, now published as US Patent Application Publication No. 2013/0078860.

(56) References Cited

OTHER PUBLICATIONS

Amendment and Response filed Feb. 3, 2015 in co-pending U.S. Appl. No. 13/879,783, now published as US Patent Application Publication No. 2013/0223034.
Amendment and Response filed Mar. 10, 2015 in co-pending U.S. Appl. No. 13/879,883, now published as US Patent Application Publication No. 2013/0244490.
Restriction Requirement mailed Jan. 22, 2015 in co-pending U.S. Appl. No. 13/880,231, now published as US Patent Application Publication No. 2013/0210276.
Response to Restriction Requirement filed Jan. 27, 2015 in co-pending U.S. Appl. No. 13/880,231, now published as US Patent Application Publication No. 2013/0210276.
Office Action mailed Feb. 27, 2015 in co-pending U.S. Appl. No. 13/410,943, now published as US Patent Application Publication No. US 2012/0161317.
Amendment and Response with RCE filed Jan. 28, 2015 in co-pending U.S. Appl. No. 13/418,853, now published as US Patent Application Publication No. US 2012/0244728.
Office Action mailed Feb. 20, 2015 in co-pending U.S. Appl. No. 13/418,853, now published as US Patent Application Publication No. US 2012/0244728.
Co-pending U.S. Appl. No. 14/621,663 titled High Performance Surface Mount Electrical Interconnect, filed Feb. 13, 2015.
Notice of Allowance and Fee(s) Due mailed Apr. 9, 2015 in co-pending U.S. Appl. No. 13/266,573, now issued as U.S. Pat. No. 9,054,097.
Notice of Allowance and Fee(s) Due mailed Apr. 13, 2015 in co-pending U.S. Appl. No. 13/318,200, now published as US Patent Application Publication No. US 2012/0056332.
Notice of Allowance and Fee(s) Due mailed May 18, 2015 in co-pending U.S. Appl. No. 14/086,029, now issued as U.S. Pat. No. 9,076,884.
Final Office Action mailed Jun. 30, 2015 in co-pending U.S. Appl. No. 13/318,369, now published as US Patent Application Publication No. US 2012/0043119.
Office Action mailed Apr. 23, 2015 in co-pending U.S. Appl. No. 13/319,158, now published as US Patent Application Publication No. 2012/0051016.
Office Action mailed Apr. 2, 2015 in co-pending U.S. Appl. No. 13/700,639, now published as US Patent Application Publication No. 2013/0078860.
Final Office Action mailed Apr. 23, 2015 in co-pending U.S. Appl. No. 13/879,783, now published as US Patent Application Publication No. 2013/0223034.
Notice of Allowance and Fee(s) Due mailed May 28, 2015 in co-pending U.S. Appl. No. 13/879,883, now published as US Patent Application Publication No. 2013/0244490.
Office Action mailed May 22, 2015 in co-pending U.S. Appl. No. 13/880,231, now published as US Patent Application Publication No. 2013/0210276.
Office Action mailed May 4, 2015 in co-pending U.S. Appl. No. 13/880,231, now published as US Patent Application Publication No. 2013/0210276.
Notice of Allowance and Fee(s) Due mailed Jun. 4, 2015 in co-pending U.S. Appl. No. 13/410,914, now published as US Patent Application Publication No. US 2012/0164888.

* cited by examiner

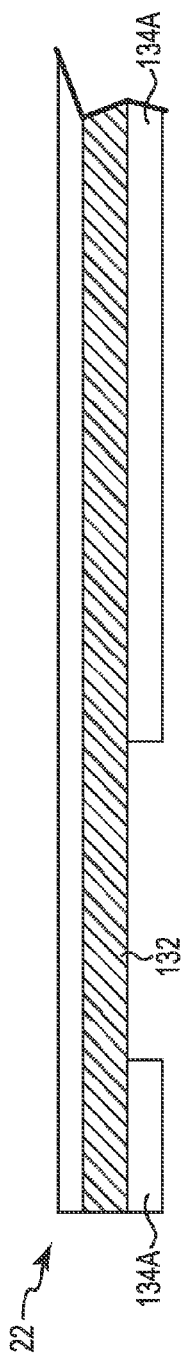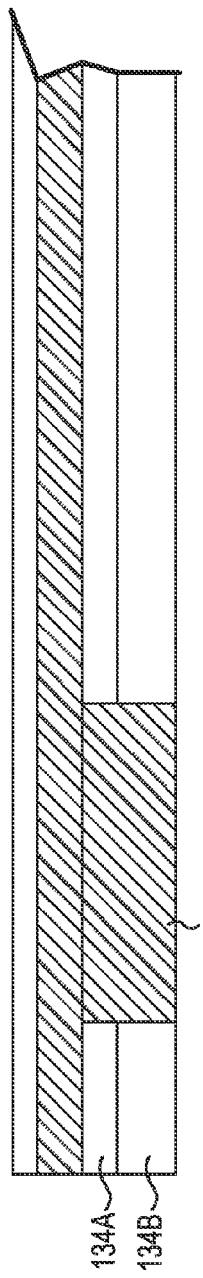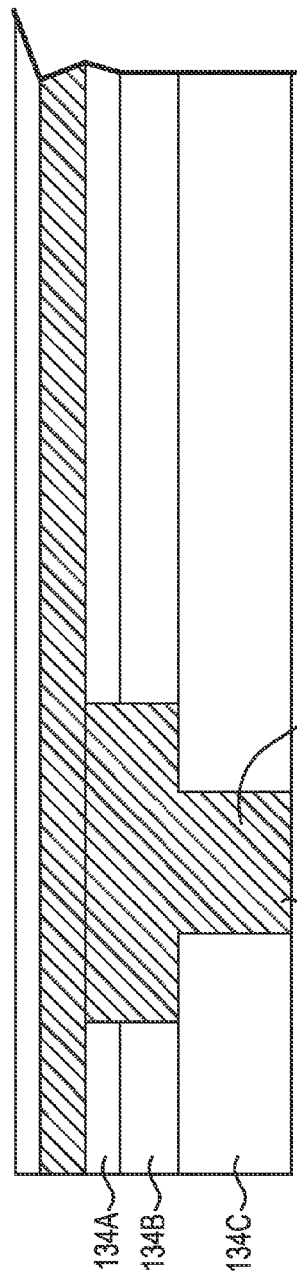

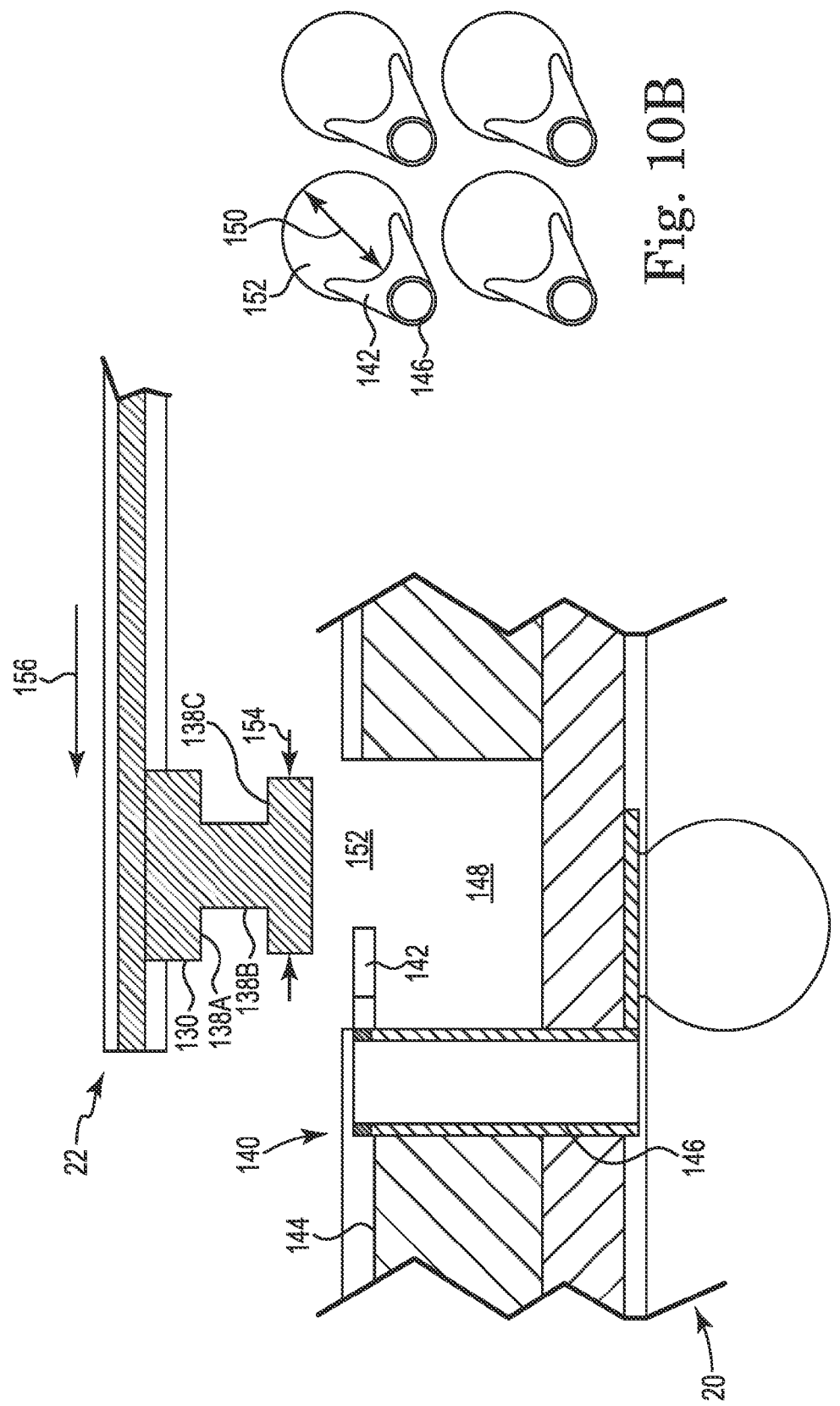

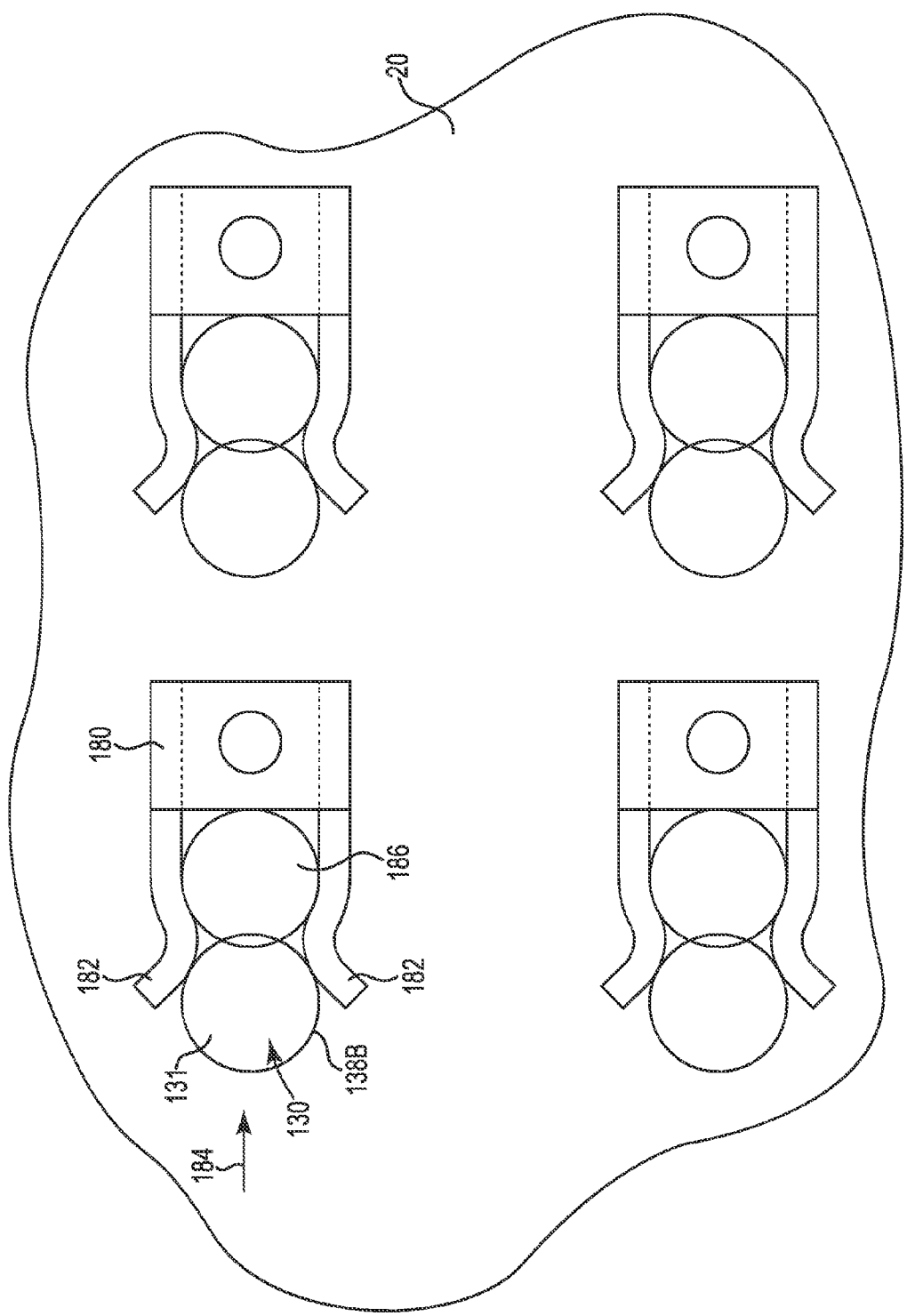

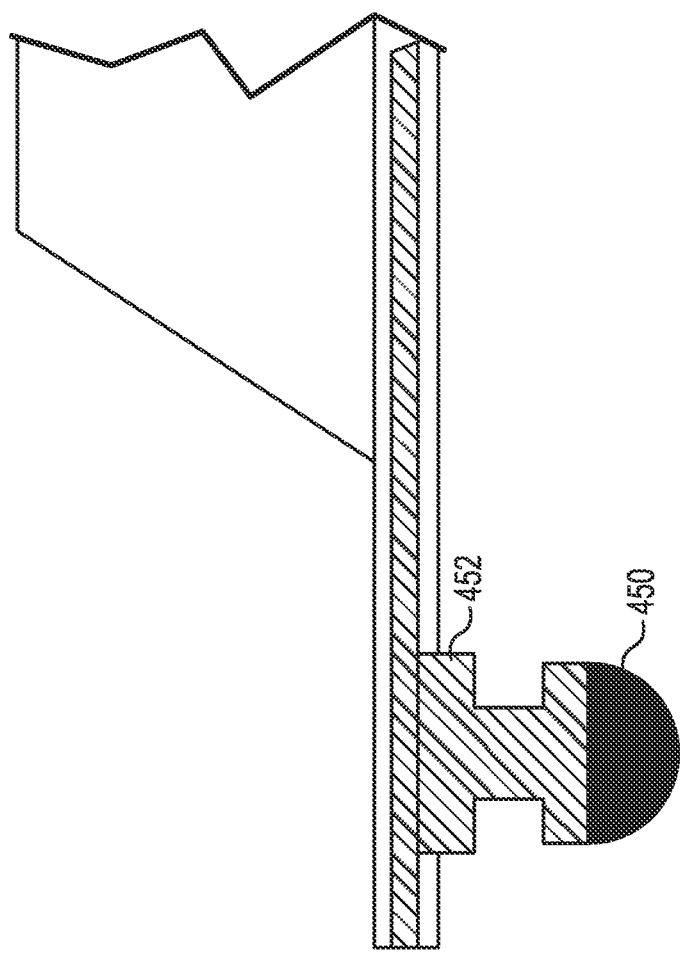

HIGH SPEED CIRCUIT ASSEMBLY WITH INTEGRAL TERMINAL AND MATING BIAS LOADING ELECTRICAL CONNECTOR ASSEMBLY

CROSS-REFERENCE TO RELATED APPLICATIONS

This application claims the benefit of a national stage application under 35 U.S.C. §371 of International Application No. PCT/US2013/030981, titled HIGH SPEED CIRCUIT ASSEMBLY WITH INTEGRAL TERMINALS AND MATING BIAS LOADING ELECTRICAL CONNECTOR ASSEMBLY, filed Mar. 13, 2013, which claims priority to U.S. Provisional Application No. 61/669,893, filed Jul. 10, 2012, all of which are hereby incorporated by reference in their entireties.

This application is a continuation-in-part of U.S. patent application Ser. No. 13/879,883, titled HIGH PERFORMANCE SURFACE MOUNT ELECTRICAL INTERCONNECT, filed Nov. 29, 2011, which claims the benefit of U.S. Provisional Application No. 61/418,625, filed Dec. 1, 2010, which are hereby incorporated by reference in their entireties.

This application is a continuation-in-part of U.S. patent application Ser. No. 13/418,853, titled HIGH PERFORMANCE SURFACE MOUNT ELECTRICAL INTERCONNECT WITH EXTERNAL BIASED NORMAL FORCE LOADING, filed Mar. 13, 2012, which claims the benefit of U.S. Provisional Application No. 61/452,875, filed Mar. 15, 2011, the disclosure of which is hereby incorporated by reference.

TECHNICAL FIELD

The present disclosure relates to a high density electrical interconnect between at least two components in an electronic system using a unique circuit structure fabrication technique that leverages processes used in the printed circuit and semiconductor packaging industries.

BACKGROUND OF THE INVENTION

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper. Flexible circuits are very commonly used in many electronic systems such as notebook computers, medical devices, displays, handheld devices, autos, aircraft and many others.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The where the material set and design features can often provide better electrical performance than a comparable rigid circuit.

Flexible circuits are connected to electrical system in a variety of ways. In most cases, a portion of the circuitry is exposed to create a connection point. Once exposed, the circuitry can be connected to another circuit or component by soldering, conductive adhesive, thermo-sonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure.

In general, flexible circuits are expensive compared to some rigid PCB products. Flexible circuits also have some limitations regarding layer count or feature registration, and are therefore generally only used for small or elongated applications.

Rigid PCBs and package substrates experience challenges as the feature sizes and line spacing are reduced to achieve further miniaturization and increased circuit density. The use of laser ablation has become increasingly used to create the via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

The process used by current technology is based upon a dry film process, where a substrate of some sort has a copper layer as the base circuit layer onto which a dry film is applied. The dry film is then patterned with a laser to create the circuit patterns. The next copper layer is added and etched as appropriate, with the laser used to drill through the film to expose the previous copper layer so a via can be plated to join the circuit layers. This process is typically used for semiconductor package substrates and larger format circuit boards, such as used in a cell phone. For larger format circuit boards, the dry film technology is used to build fine line techniques.

In both cases, the package substrate and the larger format circuit board build up are very expensive compared to traditional low density laminate technology, and suffer from several limitations inherent to the process. For example, in the case where a low density laminate base is used as the starting point for subsequent high density layers are built up, the cost increases dramatically since the entire surface of the lower density base board must be processed with the build up process across the entire area, not just in the areas where the high density is required.

Another limitation is the reliability of the via structures joining one circuit layer to another, which tend to be a barrel plated structures with the side walls of the via plated and in many cases must be filled with a via fill material to eliminate an air pocket which may separate during solder reflow temperatures. The vias require drilling through the dry film to expose the previous circuit layer in order to create the via that connects the circuit layers. The dry film is applied as a solid contiguous sheet where the material on that particular layer is restricted to that particular material across the entire layer in the build up less the areas ablated to create the via target for joining the previous and subsequent circuit layers. That is, the dry layer film is homogeneous across the entire layer.

BRIEF SUMMARY OF THE INVENTION

The present disclosure relates to a high density electrical interconnect between at least two components, such as a high density circuit to a low density PCB. By combining methods used in the PCB fabrication and semiconductor packaging industries, the present disclosure enables fine line high density circuit structures with attractive cost of manufacture.

The present disclosure adds a bulk conductive material to create very small low resistance terminals to increase density and reduce line and feature pitch of the circuits as well as a host of electrical enhancements that provide an electrical circuit that may prove to be superior to the traditional methods. The terminal can be created with various features, including undercuts, that cannot be formed using dry film technology.

One embodiment is directed to a high density circuit assembly including an array of integral terminals plated on a first circuit member including an electro-lessly plated shell with an electro-plated core. A printed circuit board includes a plurality of are electrically coupled with circuitry on the printed circuit board and extend into the recesses. Insertion of the integral terminals on the first circuit member into the recesses on the PCB is a zero or low insertion force process. Shifting the printed circuit board relative to the first circuit member electrically couples the integral terminals with the contact members.

The integral terminal can be a variety of shapes, including a non-cylindrical shape. The integral terminals preferably include a plurality of discrete contact surfaces that electrically couple with the contact members on the PCB. In one embodiment, the integral terminals include a narrow portions and the contact members include arms that mechanically couple with the narrow portions on the integral terminals. In another embodiment the terminals include at least one feature, such as an undercut, that cannot be formed using dry film technology.

The present disclosure is also directed to a method of making an array of integral terminals on a circuit assembly. The method includes the steps of depositing at least a first liquid dielectric layer on the first surface of a first circuit member. The dielectric material is imaged to create a plurality of first recesses corresponding to the array of integral terminals, via holes, and channels for circuit traces. The selected surfaces of the first recesses are processed to accept electro-less conductive plating deposition. Electro-lessly plating is applied to the selected surfaces of the first recesses to create a plurality of first conductive structures electrically coupled to, and extending generally perpendicular to, the first circuitry layer. A plating resist is applied, followed by electro-plating to the electro-less plating to substantially fill first recesses with a conductive material. The steps of depositing, processing, electro-less plating, and electro-plating are repeated to form the integral terminals of a desired shape. The dielectric layers are then removed to expose the terminals.

In one embodiment, a printed circuit board is prepared with a plurality of recesses configured to receive the integral terminals. A plurality of contact members that are electrically coupled with circuitry on the printed circuit board are configured to extend into the recesses. The integral terminals on the first circuit member are positioned in the recesses of the printed circuit board. Shifting the printed circuit board relative to the first circuit member electrically couples the integral terminals with the contact members.

own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the circuit assembly.

The vias and associated circuit geometry can be imaged in the liquid dielectric in a variety of shapes and sizes, depending on the terminal structure on the circuit members. The contact members and vias can be positioned at a variety of locations, heights, or spacing to match the parameters of existing connections making it easy to replace an existing circuit without changing hardware or the PCB. The present disclosure permits the creation of blind or buried conductive structures on very tight pitch of about 25 microns or below without the use of laser ablation.

Traditional PCB and flex circuit fabrication methods take sheets of material and stack them up, laminate, and/or drill. The materials in each layer are limited to the materials in a particular sheet. The present disclosure employs a liquid dielectric that is image, permitting a wide variety of materials to be applied on a single layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

BRIEF DESCRIPTION OF THE SEVERAL VIEWS OF THE DRAWING

FIGS. 9A-9F illustrate a method of making a free standing integral terminal in accordance with an embodiment of the present disclosure.

FIGS. 10A and 10B illustrate a connector on a PCB configured to mate with the terminal of FIG. 9E in accordance with an embodiment of the present disclosure.

FIG. 12 illustrates another connector on a PCB configured to mate with the terminal of FIG. 9E in accordance with an embodiment of the present disclosure.

FIGS, 24A and 24B illustrate alternate engagement mechanisms between contact members and integral terminals on a first circuit member in accordance with an embodiment of the present disclosure.

Figure 25:
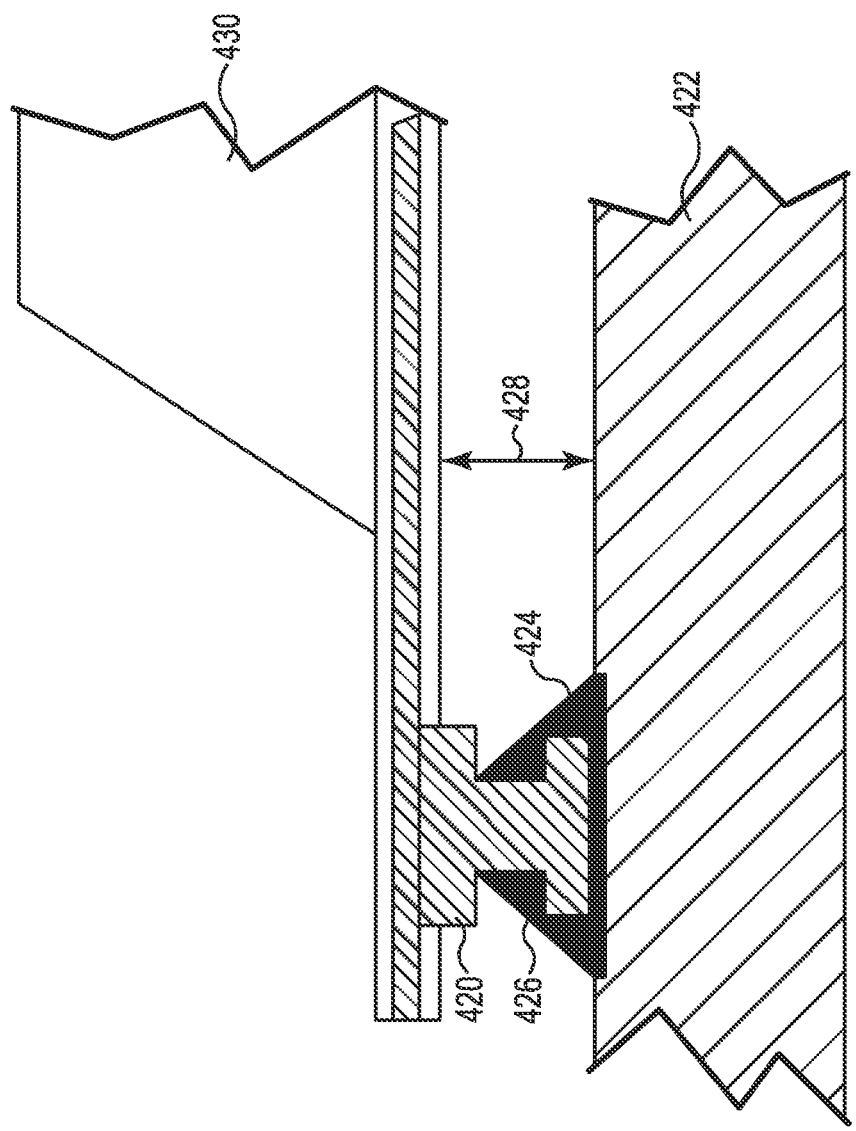

FIG. 25 illustrates an embodiment in which terminals are soldered to PCB in accordance with an embodiment of the present disclosure.

FIG. 26 illustrates a solder deposit on the terminals in accordance with an embodiment of the present disclosure.

DETAILED DESCRIPTION OF THE INVENTION

A high density circuit structure according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high density circuit structures are especially useful for communications, wireless, and memory devices.

The present high density circuit structure can be configured as a low cost, high signal performance electrical interconnect assembly, which has a low profile that is particularly useful for desktop and mobile PC applications. IC devices can be installed and uninstalled without the need to reflow solder. The solder-free electrical connection of the IC devices is environmentally friendly. In another embodiment, the high density circuit structure can also be a portion of a socket or semiconductor package.

Figure 1A:
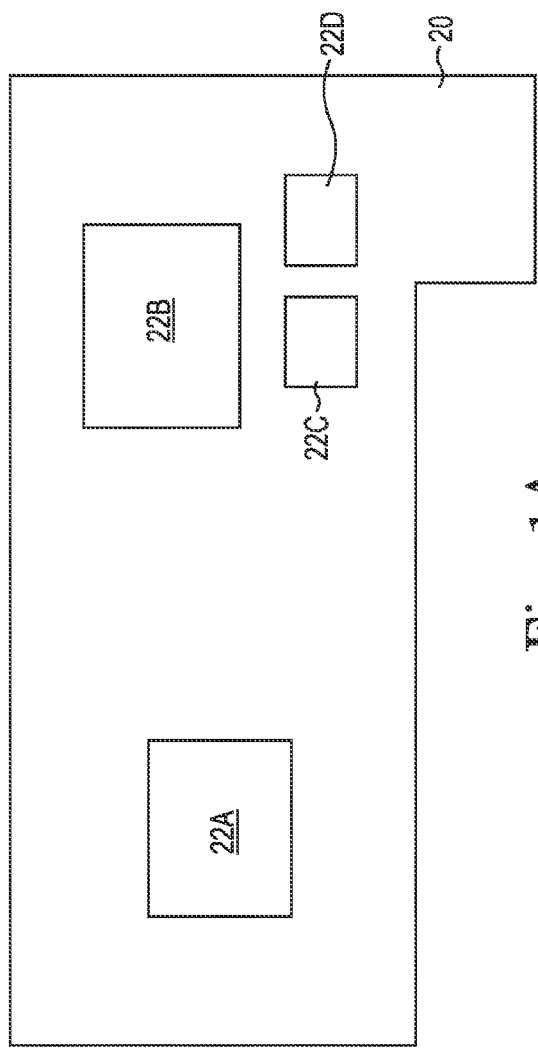
FIGS. 1A and 1B are top and side views of a plurality of high density circuit structures combined with a low density PCB in accordance with an embodiment of the present disclosure.
Figure 1B:
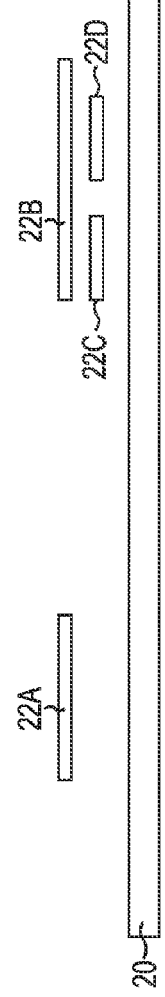
Figure 1C:
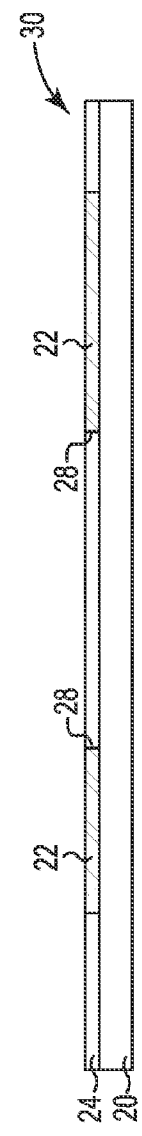
FIG. 1C is a side view of the PCB merged with the high density circuit structures in accordance with an embodiment of the present disclosure.

FIGS. 1A and 1B schematically illustrate the merger of a lower density circuit 20 with one or more high density circuits 22A, 22B, 22C, 22D ("22") into the contiguous assembly of FIG. 10. The lower density circuit 20 may be a printed circuit board, a flexible circuit, or the like. The high density circuit 22 can be a printed circuit board, an IC socket, a semiconductor package, or the like.

Dielectric material 24 is optionally applied to the surface 26 of the low density circuit 20 so the location of the high density circuits 22 is at least partially defined and isolated. The dielectric material 24 may be a film or a liquid dielectric. The dielectric material 24 is imaged to expose the circuit locations 28 for the high density circuits 22, improving alignment of vias on the lower density main core 20 with the high density circuits 22.

As will be discussed in more detail below, the dielectric 24 is optionally processed to enable electro-less or electrolytic copper plating to adhere to the surface of the dielectric and grow a thick trace or pillar or via structure within the imaged region with undesired areas remaining un-plated or post plate etched to remove unwanted copper. Once the surfaces are plated, a higher deposition rate electroplate copper can be applied to build up the thickness or area of copper as desired.

If the circuit assembly 30 is a flexible circuit, the base layer can be a material such as polyimide or liquid crystal polymer. If the circuit assembly 30 is a rigid circuit board, the base can be FR4 or one of many high speed laminates or substrates. If the circuit assembly 30 is a semiconductor package, the base can be a material such as FR4, BT resin of any one of a variety of laminate or substrate materials. If the circuit assembly 30 is an electrical connector or socket, the base can be molded LCP, machined plastic, or a variety of films or substrate materials.

The high density circuits 22 (also referred to as "coupons") can be made using conventional build up technology described above or using the process described below. The high density circuits 22 are then merged with the low density circuit 20. In another embodiment, the high density circuits 22 can be fabricated in-situ directly on the low density circuit 20 using the processes described herein. The present method permits the high density circuits 22 to be formed directly in the circuit locations 28, without having to extend the processing across the entire low density circuit 20.

Figure 2A:
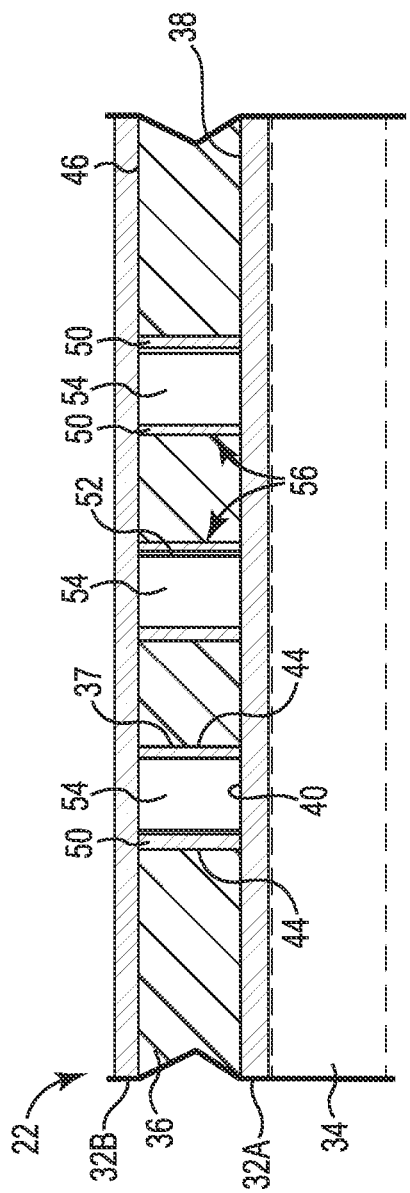
FIG. 2A is a cross-sectional view of a method of making a high density circuit structure in accordance with an embodiment of the present disclosure.

FIG. 2A is a side cross-sectional view of a method of making the high density electrical circuits 22 in accordance with an embodiment of the present disclosure. The first step is to start with base material of some sort, such as a copper foil 32A or a core 34 of some sort to act as a support member. If the starting base is copper foil 32A, then the foil can act as the first layer circuitry or escape layer which would be the layer to be merged with the circuit locations 28 on the low density circuit 20. In the case where the high density circuit 22 is a semiconductor package, the foil 32A can be the termination points for BGA attachment to the low density circuit 20. The base 34 can also be a sacrificial member that is removed at some point later in the process to reveal the individual coupons 22.

In the illustrated embodiment, copper foil circuitry layer 32A is located on reinforcing layer 34. The layer 34 can be a traditional PCB or laminated to a The circuitry layer 32A can be preformed or can be formed using a fine line imaging step is conducted to etch copper foil as done with many PCB processes.

Liquid dielectric material 36 is applied to surface 38 and flows between the regions of the circuitry 32A. A dry dielectric film, by contrast, does not flow into the recessed regions. The dielectric layer 36 can be tack cured to partially link the polymer and allow for handling, while retaining the ability to image the material in a photolithography process. Alternatively, the dielectric layer 36 can be processed with a laser direct imaging process known as LDI.

The dielectric material 36 is typically imaged to create recesses 37 that expose the desired locations 40 on circuitry layer 32A with theoretical via locations 37 created as part of the image directly in proximity to the circuitry layer 32A. One benefit of imaging the dielectric layer 36 is that the via structures do not need to be round as with traditional drilled vias. Any shape that can be imaged and will result in a grown full metal via 54 of the desired shape.

The dielectric surface 46 can be planarized to create a very consistent dielectric thickness and planarity, as well as assist with preparing select surfaces for electro-less copper plating adhesion.

The dielectric layer 36 is preferably processed to promote electro-less copper plating using one or more of plasma treatment, permanganate, carbon treatment, impregnating copper nano-particles to activate the desired surfaces to promote electroplating. In the illustrated embodiment, the dielectric material 36 is processed to promote plating adhesion to the side walls 44 of the recesses 37. Electro-less copper plating is applied to the side walls 44 of the recesses 37 to create conductive structures 50, resulting in a three-dimensional landscape. Additional discussion of the use of electro-less plating of the dielectric structure is disclosed in PCT/US2012/53848, filed Sep. 6, 2012, entitled DIRECT METALIZATION OF ELECTRICAL CIRCUIT STRUCTURES, the entire of disclosure of which is hereby incorporated by reference.

A plating resist is applied, imaged and developed to expose the via location 37 and previous circuit layer 32A. In the illustrated embodiment, the conductive structure 50 is an annular-shaped via electrically coupled to the circuitry layer 32A with a center opening or recess 52. Once the surfaces 44 of the dielectric material 36 are plated, a higher deposition rate electroplate copper can be used to fill the resist is stripped and the copper deposition 50, 54 is optionally planarized. The resulting conductive pillars 56 include a shell 50 of electro-less conductive material and a core 54 of electro-plated conductive material.

A present process creates the ability to stack full metal vias 54 in subsequent deposition steps to create a high aspect ratio via without the need to drill through the entire stack 22 in one operation. Another benefit is the ability to provide a mounting point for a packaged semiconductor device where a copper pillars 54 are created as an alternative to conventional via in pad construction which can be plagued with reliability issues and high costs to manufacture.

In another embodiment, the present process enhances the electroplating process is to deposit electro-less copper or copper flash to provide a bus structure for bulk copper electro plating. The copper bus structure is subsequently removed with a differential etch process that leaves bulk copper 54 intact. An alternate step can be employed to add multiple layers of resist 36 and continue the copper growth procedure if desired, with the resulting structures encapsulated by the next dielectric application.

The shape of the conductive structures 50, 54 is dictated by the shape of the recesses 37. A square recess 37 results in a square-shaped conductive structure 54. The plating process can be controlled to a certain degree, but in some cases with fine pitch geometries and high speed circuits, upper surfaces 46 of the dielectric 36 and the conductive structure 54 may vary in topography or height relative to the field, and the dielectric material 36 may vary in thickness slightly especially if liquid material is used. Consequently, it is preferred to planarize to surfaces 46 of the conductive structures 54 and the exposed surface 46 of the dielectric 36 between steps to control thickness and flatness of the electrical circuit 22.

In the illustrated embodiment, additional foil layer 32B is applied and processed to create a circuit structure using any of the techniques discussed herein. The conductive material 54 electrically couples the circuit layer 32A to the circuit layer 32B.

The present method permits the material between layers and within each layer to be varied. One aspect of the present process that differs from the traditional dry film build up process is the nature of the dielectric deposition in liquid form. The dielectric layer 36 can be applied by screen printing, stencil printing, jetting, flooding, previous circuit landscape 32A. During the development process, desired regions remain and the regions that are not desired are washed away with fine resolution of the transition regions within the landscape. Multiple depositions steps can be tack cured and imaged such that thicker sections of dielectric 36 can be developed and washed away in one or multiple strip operations. As a result, internal cavities or mass regions can be excavated and subsequently filled at the next dielectric layer with materials that have physical properties differing from the base dielectric 36. In other words, the excavated regions can be filled or treated with materials that have a different dielectric constant, vary in conductive or mechanical or thermal properties to achieve a desired performance function not possible with a contiguous dry film technique. In basic terms, the present process not only provides the ability to alter the material set and associated properties in a given layer, but the material set can be altered at any given point within a given deposition or layer.

The present process can also be used in combination with existing dry film techniques. For example, one or more of the layers can be a preformed dielectric film to leave air dielectric gaps between traces. Recesses 37 in the dielectric layer 36 that expose circuitry 32A can be formed by printing, embossing, imprinting, laser cutting, chemical etching with a printed mask, or a variety of other techniques.

Figure 2B:
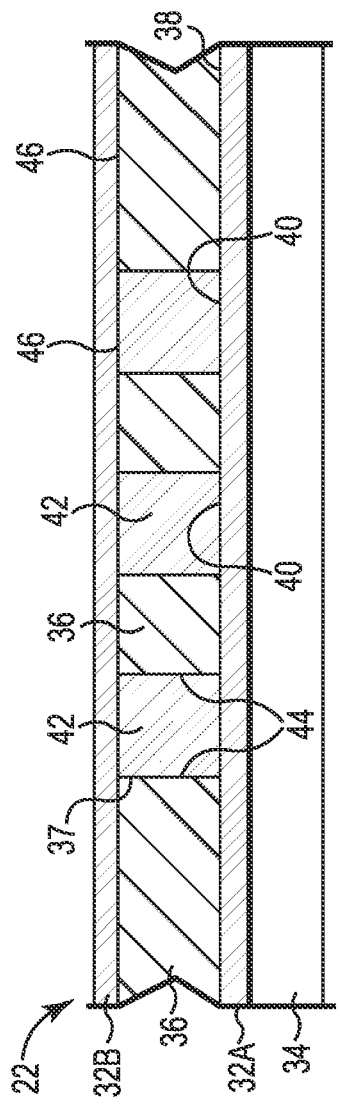
FIG. 2B is a cross-sectional view of an alternate method of making a high density circuit structure in accordance with an embodiment of the present disclosure.

FIG. 2B illustrates an alternate high density electrical circuit 22 in accordance with an embodiment of the present disclosure. The process is the same as discussed in connection with FIG. 2A, except that the sidewalls 44 of the dielectric material 36 are not processed to receive electro-less plating. Rather, a bulk conductive material 42 is applied directly to exposed portions 40 of the circuit layer 32A. The surface 46 is preferably planarized and the circuit layer 32B is applied using any of the techniques disclosed herein.

Figure 3:
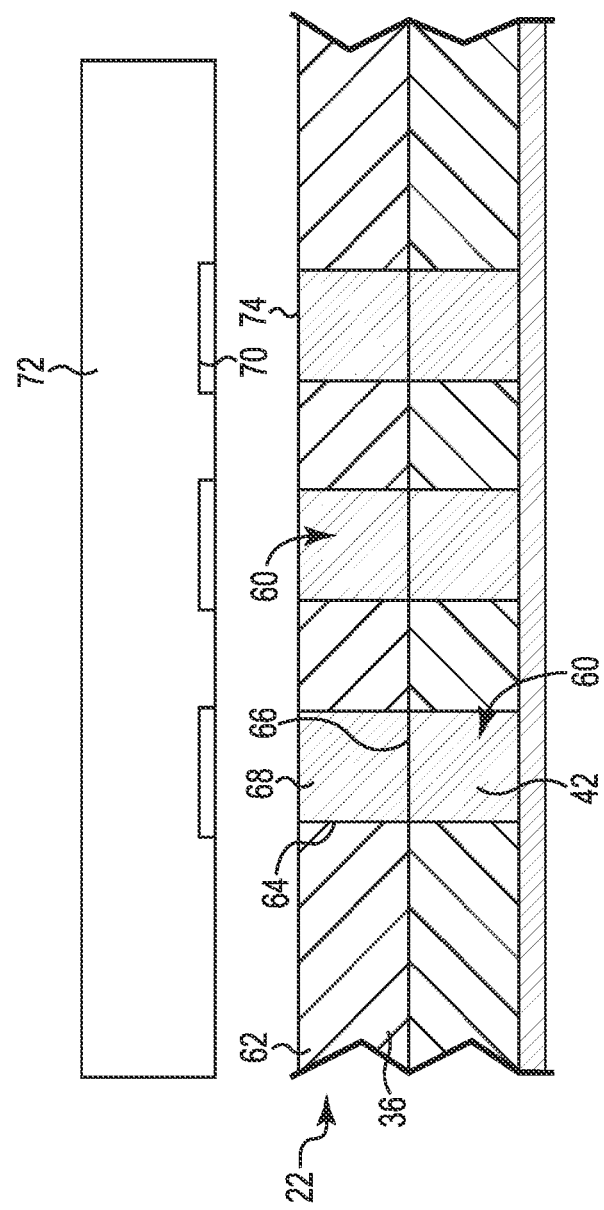
FIG. 3 illustrates an optional additional layer on the high density electrical circuit of FIG. 1 in accordance with an embodiment of the present disclosure.

FIG. 3 illustrates higher aspect ratio conductive pillar 60 formed on the electrical circuit 22 without the foil layer 32B. The process discussed above is repeated by applying another layer 62 of liquid dielectric 36 that is imaged to created recesses 64 that expose the upper surface 66 of the copper pillar 42. The upper surfaces 66 of the copper pillars 42 are then plated as discussed above to create conductive extension 68 of the copper pillar 42.

In one embodiment, the conductive extensions 68 are planarized to permit die attach point 70 to facilitate flip chip attach of the die 72 to the conductive extensions enlarged to facilitate soldering of the die 72 to the conductive extensions 68.

Figure 4:
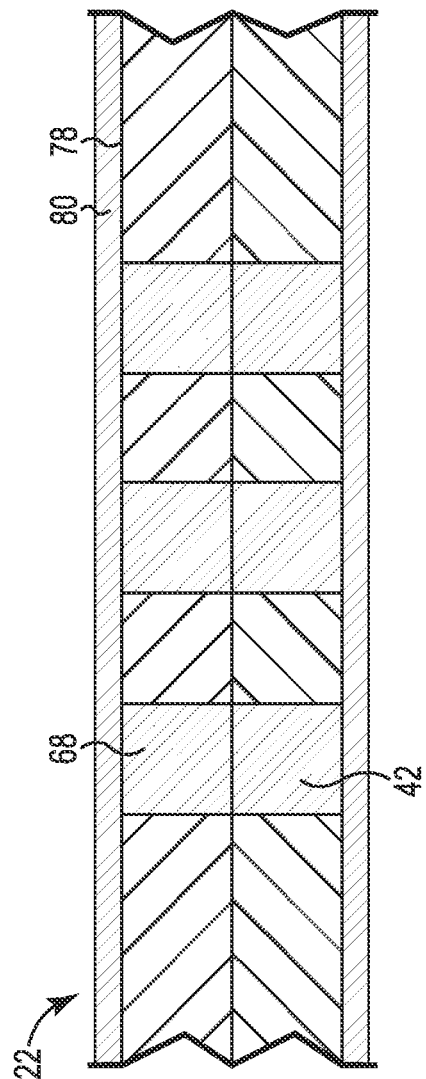
FIG. 4 illustrates application to a second circuitry layer to the high density electrical circuit of FIG. 1 in accordance with an embodiment of the present disclosure.

FIG. 4 illustrates circuitry layer 80 is applied to the top surface 78 of the electrical circuit 22 and coupled to the conductive extensions 68. The circuitry layer 80 creates the base for additional routing layers and to facilitate vertical connection to subsequent layers in the stack in accordance with an alternate embodiment of the present disclosure.

Figure 5:
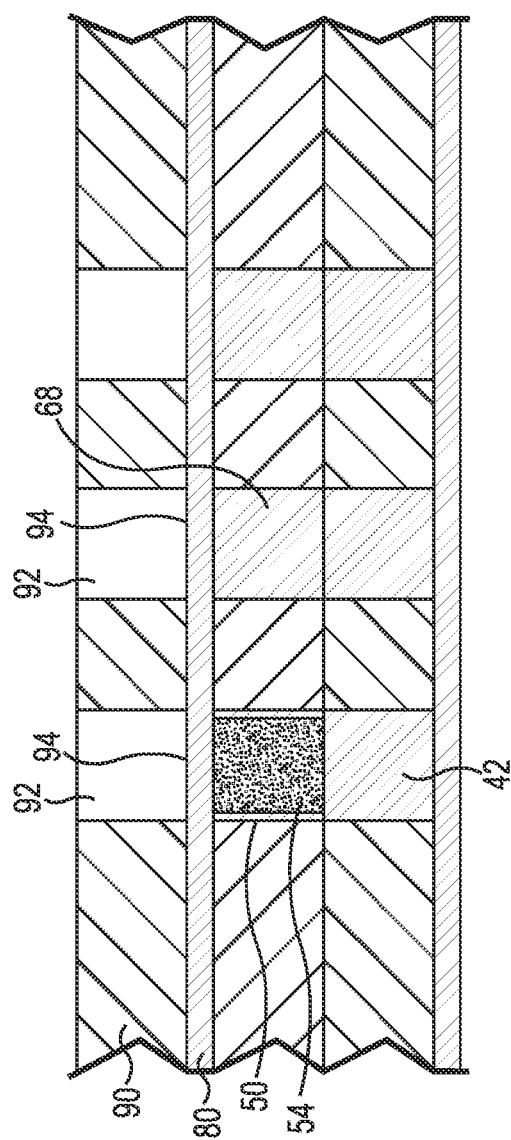
FIG. 5 illustrates an optional dielectric layer on the high density electrical circuit of FIG. 1 in accordance with an embodiment of the present disclosure.

FIG. 5 illustrates liquid dielectric layer 90 added to the subsequent circuitry layer 80 in accordance with an alternate embodiment of the present disclosure. The liquid dielectric layer 90 is imaged to create recesses 92 that expose portions 94 of the circuitry layer 80 that corresponds with the via extensions 68. The dielectric layer 90 protects the portions of the circuitry layers 80 that are not to be etched and provides access to the foil intimate to the conductive structures 42 and 68. In one embodiment, the extension 68 is optionally conductive structure 50 with a core 54 of conductive or non-conductive material.

Figure 6:
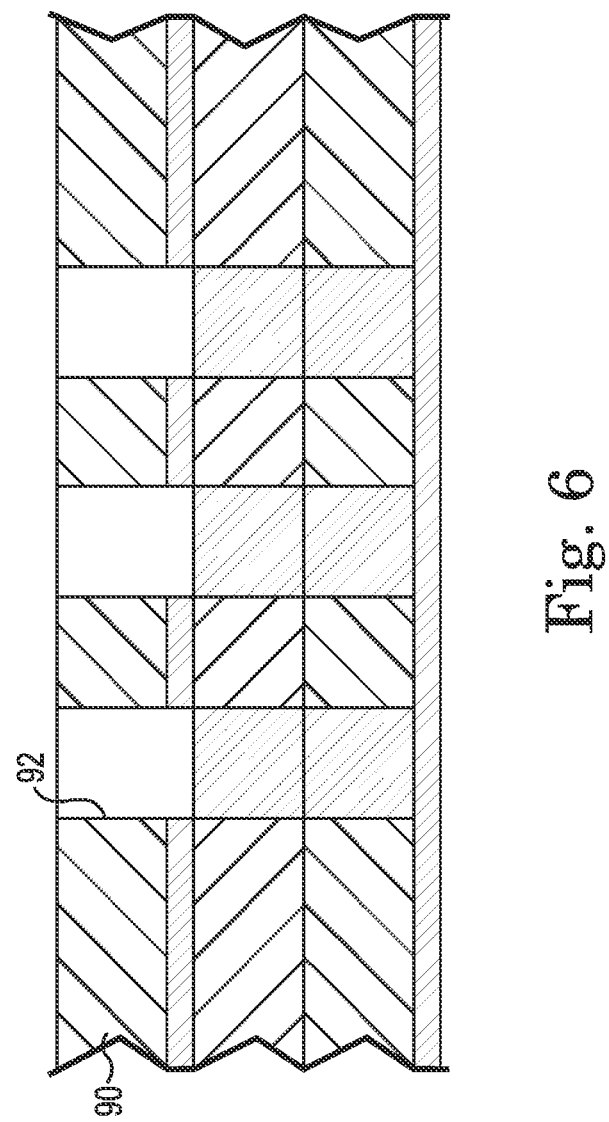
FIG. 6 illustrates an optional etching step on the high density electrical circuit of FIG. 1 in accordance with an embodiment of the present disclosure.

FIG. 6 illustrates a subsequent etch process that removes the copper foil 94 (see FIG. 5) located in the recesses 92 to allow access for the next plating step to join the layers together in accordance with an alternate embodiment of the present disclosure.

Depending on the dielectric material 90 and desired final construction, the resist layer 90 can be stripped to provide a level to be planarized as the base of further processing or the resist layer 90 can be left in place provided it is of the proper material type. The exposed regions that provided access for etch and plating can be filled with similar material to seal the layer which can be planarized for further processing if desired.

Figure 7:
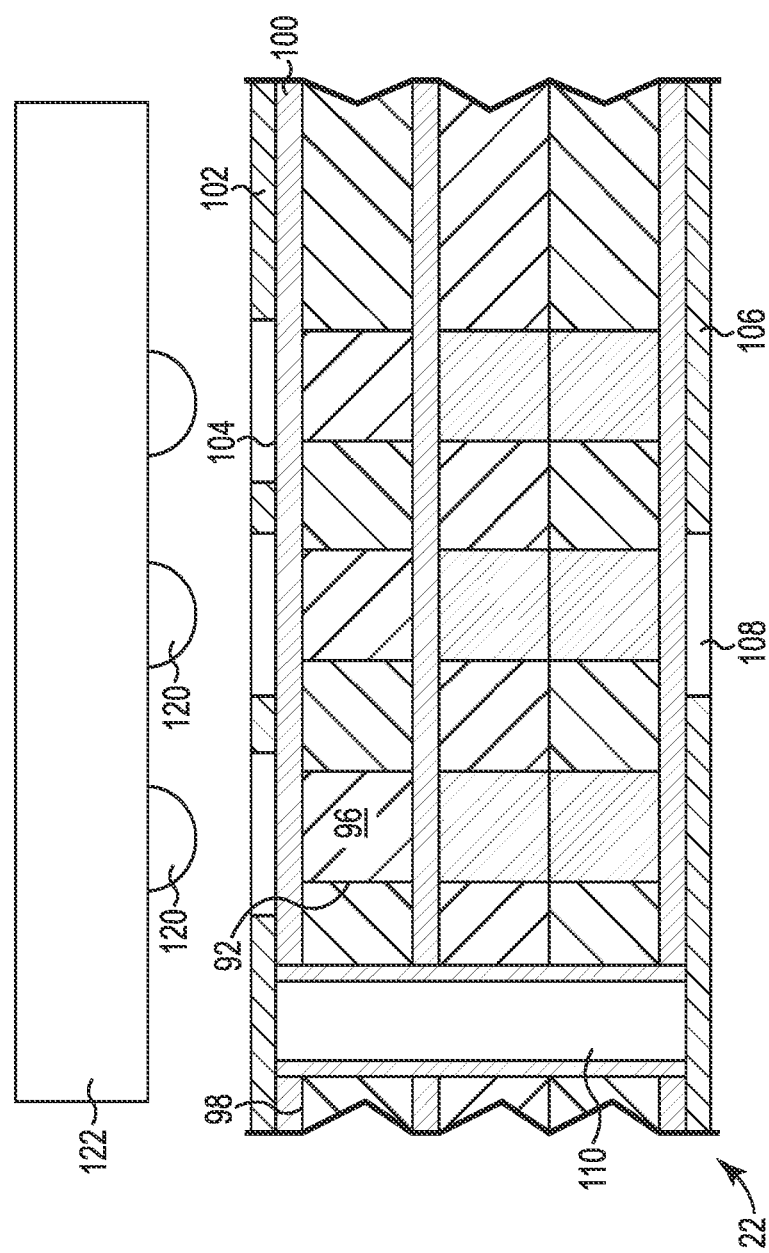
FIG. 7 illustrates an electrical interconnect interfaced with a BGA device in accordance with an embodiment of the present disclosure.

FIG. 7 illustrates one possible variation of the electrical circuit 22. Recesses 92 are filled with a dielectric material 96 and the surface 98 is planarized to receive circuitry plane 100. Liquid dielectric layer 102 is deposited on the circuitry plane 100 and imaged to expose selective regions 104. The selective regions 104 are configured to correspond to solder balls 120 on BGA device 122. In the illustrated embodiment, bottom dielectric layer 106 is optionally deposited on circuitry layer 52 in a manner to expose selective regions 108.

In one embodiment, the electrical circuit 22 is further processed with conventional circuit fabrication processes to create larger diameter through vias or device termination locations 104, 108, laser direct imaging, legend application etc. In another embodiment, the via 110 is formed using electro-less plating of each layer of the stack, as illustrated in FIG. 6.

Figure 8:
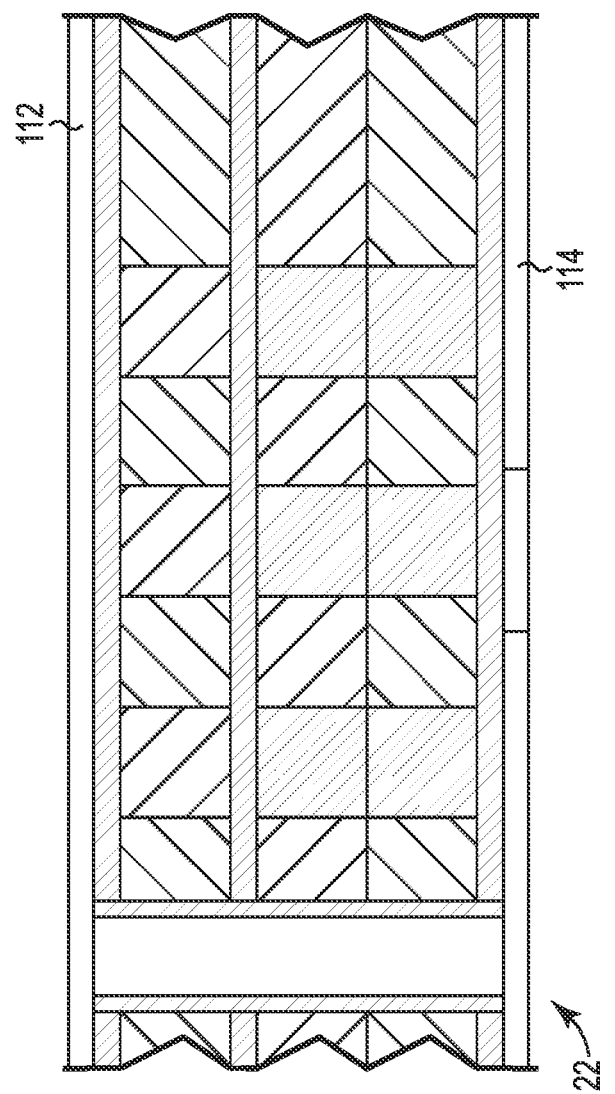
FIG. 8 illustrates an electrical interconnect for a flexible circuit in accordance with an embodiment of the present disclosure.

FIG. 8 illustrate an alternate embodiment in which the electrical circuit 22 is used in a flexible circuit applications. The electrical circuit 22 is laminated with ground planes and cover layers 112, 114. In some applications the insulating layers 112, 114 are applied by jet printing of polyimide or liquid crystal polymers (LCP) inks as a final layer or as a combination of laminated film and jetted material.

FIGS. 9A-9E illustrate an embodiment in which the electrical circuit 22 is enhanced by selectively plating terminals 130 (see FIG. 9E) to traces or target pads 132 in accordance with an embodiment of the present disclosure. The electrical circuit 22 is processed with an imageable or ablateable plating resist 134A in order to keep the target pad 132 of base copper exposed. In the preferred embodiment, the resist 134 is a liquid material that is imaged to expose the target pad 132, as discussed herein.

Another layer 134B of liquid plating resist is added and exposed. The target pad 132 is plated with copper 136 to build up the terminal 130. Additional liquid resist layers 134C (FIG. 9C) and further copper plating form a neck portion 131 of the terminal 130. A final resist layer 134D (FIG. 9D) is added and further copper 136 is plated onto the terminal 130.

Multiple layers of resist 134 can be built up and a variety of terminal shapes can be created as a function of the resist thickness and the shape of the target opening where plating is deposited to the previous target layer while not depositing onto the resist.

Figure 9E:
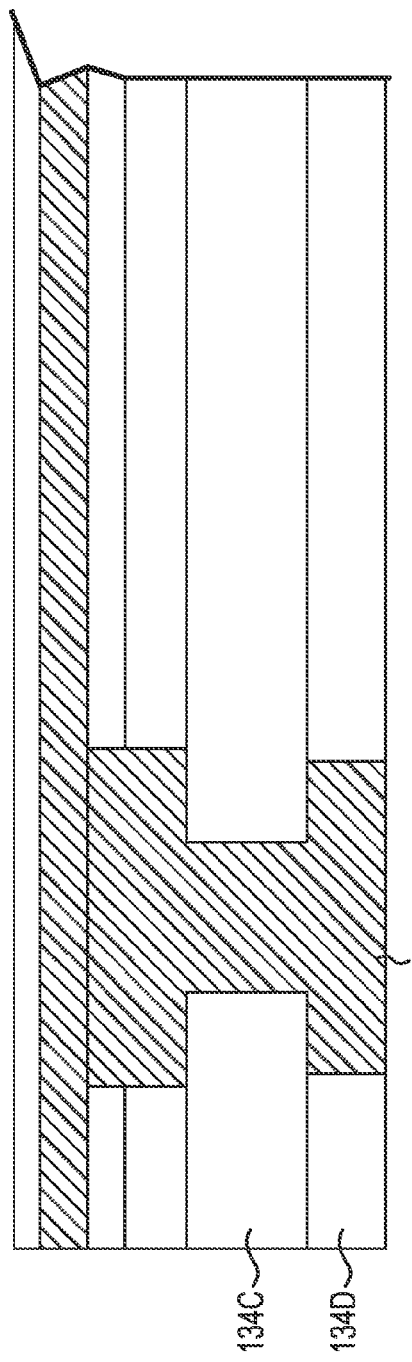
Figure 9F:
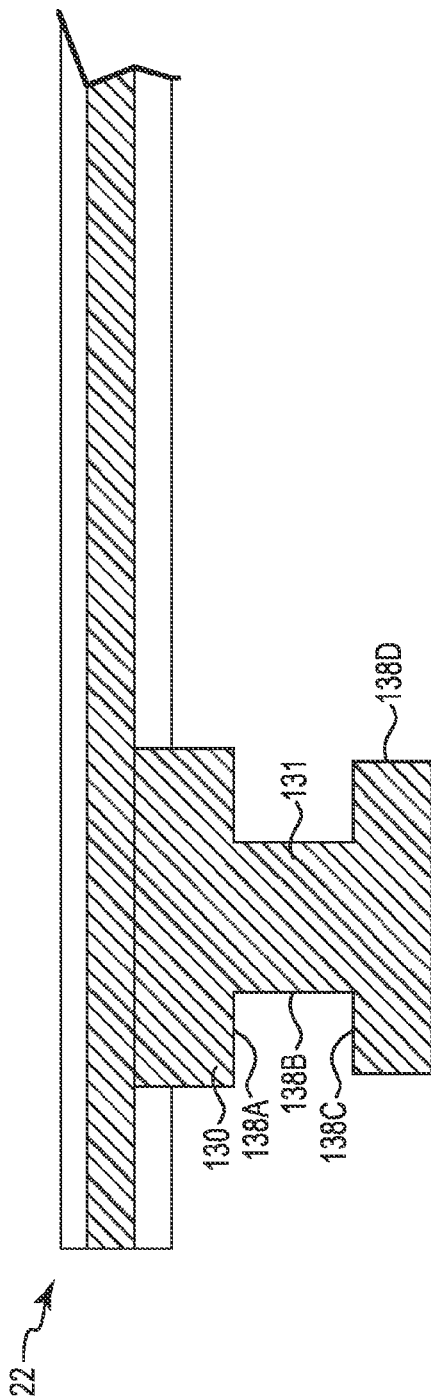

Upon reaching the desired terminal formation illustrated the resist layers 134 are stripped as a mass or congruous material set as illustrated in FIG. 9E. The built-up or free standing integral terminal 130 is left as part of the circuit assembly 22. In the illustrated embodiment, the free standing post or terminal 130 includes a plurality of contact surfaces or facets 138A, 138B, 138C, 138D, 138E ("138") that can potentially electrically couple with the PCB 20 (see FIG. 1A). Neck portion 131 provides an undercut that cannot be formed using dry film technology.

The terminals 130 can be a variety of shapes to facilitate engagement with the PCB 20, such as for example, cylindrical or non-cylindrical, regular or irregular, symmetrical or asymmetrical, rectangular, curvilinear, and the like. The layers 134 typically not possible to make using conventional molding or machining techniques, referred to herein as a "non-moldable feature."

While a single terminal is shown in FIG. 9E, with fields of terminals in mass quantities can be created simultaneously and mass plated with final finish as desired (see e.g., FIG. 12). For some applications such as with a semiconductor package, rigid or flex circuit that may benefit from a solder terminal either for final reflow or temporary connection, the terminal 130 can be constructed of solder.

The shape of the terminal 130 can form a connection to a mating connector with contact members shaped in such a way that the terminals can be biased or engaged to create a mechanical and electrical connection, in some cases in a self retained fashion and in other cases with the assistance of an external loading or load maintaining mechanism to enable long term connection.

FIGS. 10A and 10B illustrate side and top views of a mating connector 140 on PCB 20 configured to engage with the terminal 130 in accordance with an embodiment of the present disclosure. The circuit stack for the PCB 20 is preferably constructed using the techniques discussed herein.

Contact members 142 are attached to surface 144 of the PCB 20 and electrically coupled to via 146. The contact members 142 cantilever over a portion of recesses 148 that are sized to receive the terminals 130. As best illustrated in FIG. 10B, diameters 150 of exposed portions 152 of the recesses 148 are greater than diameters 154 of the terminals 130.

In operation, the terminals 130 are aligned with the exposed portions 152 and inserted. By shifting the circuit assembly 22 in direction 156, one or more of the surfaces 138A, 138B, or 138C electrically couple with the contact members 142. In the preferred embodiment, multiple surfaces 138 engage with the contact members 142.

In one embodiment, the contact members 142 are part of a preformed circuit structure that is laminated onto the surface 144. Unwanted portions of the copper circuit structures is then etched away. In another embodiment, the recesses 148 are temporarily filled with a solder mask and the contact members 142 are imaged in the locations shown. The solder mask is then removed to reveal the recesses 148 and the cantilevered contact members 142.

Figure 11B:
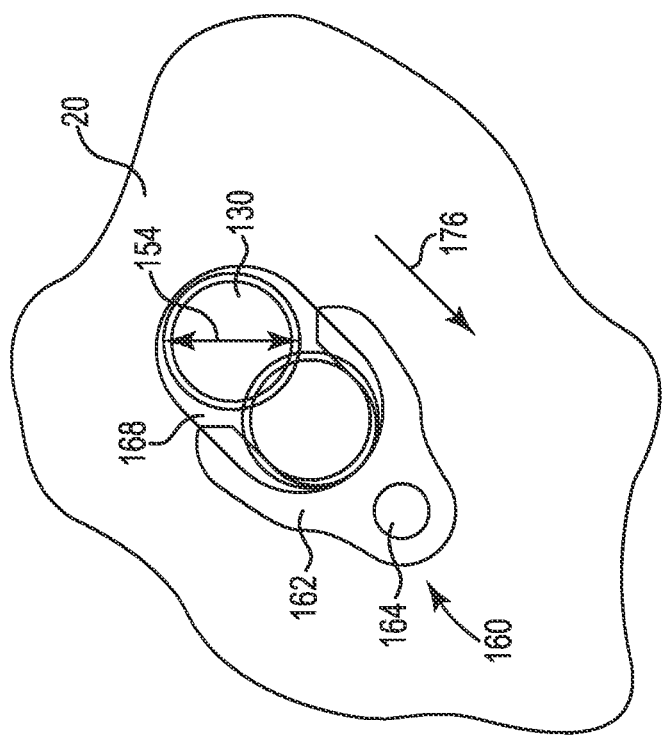
FIGS. 11A and 11B illustrate an alternate connector on a PCB configured to mate with the terminal of FIG. 9E in accordance with an embodiment of the present disclosure.
Figure 11A:
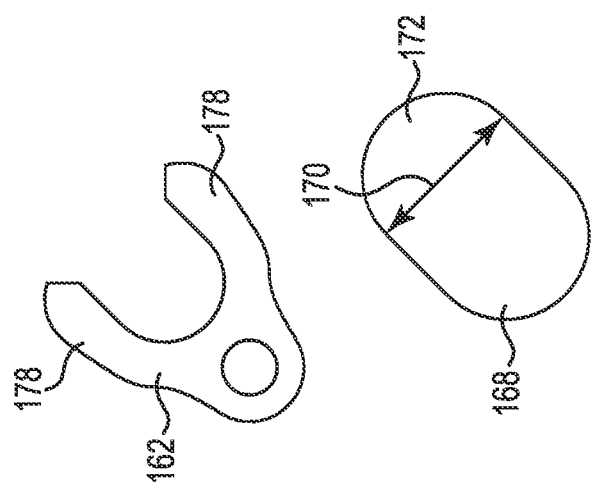

FIGS. 11A and 11B illustrate an alternate mating connector 160 in accordance with an embodiment of the present disclosure. Contact members 162 are attached to the PCB 20 and electrically coupled to via 164. The contact members 162 cantilever over a portion of elongated recesses 168 that are sized to receive the terminals 130. The circuit member 22 is removed to expose the terminals 130. Diameters 170 of the exposed portions 172 of the recesses 168 are greater than diameters 154 of the terminals 130.

In operation, the terminals 130 are aligned with the exposed portions 172 and inserted. By shifting the circuit assembly 22 in direction 176, one or more of the surfaces 138A, 138B, or 138C (see FIG. 10A) electrically couple with the contact members 162. Arms 178 of the contact members 162 preferably extend around slightly less than 180 degrees of the terminal 130 to maximize contact surface area.

The arms 178 preferably contact wrap around at least 120 degrees and preferably at least 150 degrees of the terminals 130. In another embodiment, the arms 178 contact the terminals 130 in at least two locations.

The shapes and patterns of the contact members 142, 162 can be created, with contacts inserted discretely as individual members or blanked or etched from sheet or strip material to enable in-situ creation of the contact field, with shapes complimentary to the terminal shape for reliable low force engagement.

FIG. 12 illustrates an array of contact members 180 with compliant arms 182 on a PCB 20 that provide self-retention or snap-fit engagement with the terminals 130 in accordance with an embodiment of the present disclosure. The contacts can be stamped and formed from a variety of resilient conductive materials.

In the illustrated embodiment, the electrical circuit 22 is removed to expose the terminals 130. In the illustrated embodiment, the surfaces 138B of the neck portion 131 (see FIG. 10A) of the terminals 130 are positioned to engage with the arms 182. The terminals 130 are shifted in direction 184 the arms 182 flex outward. Once the terminal 130 is in region 186 it is trapped by the resilient force of the compliant arms 182.

Figure 13:
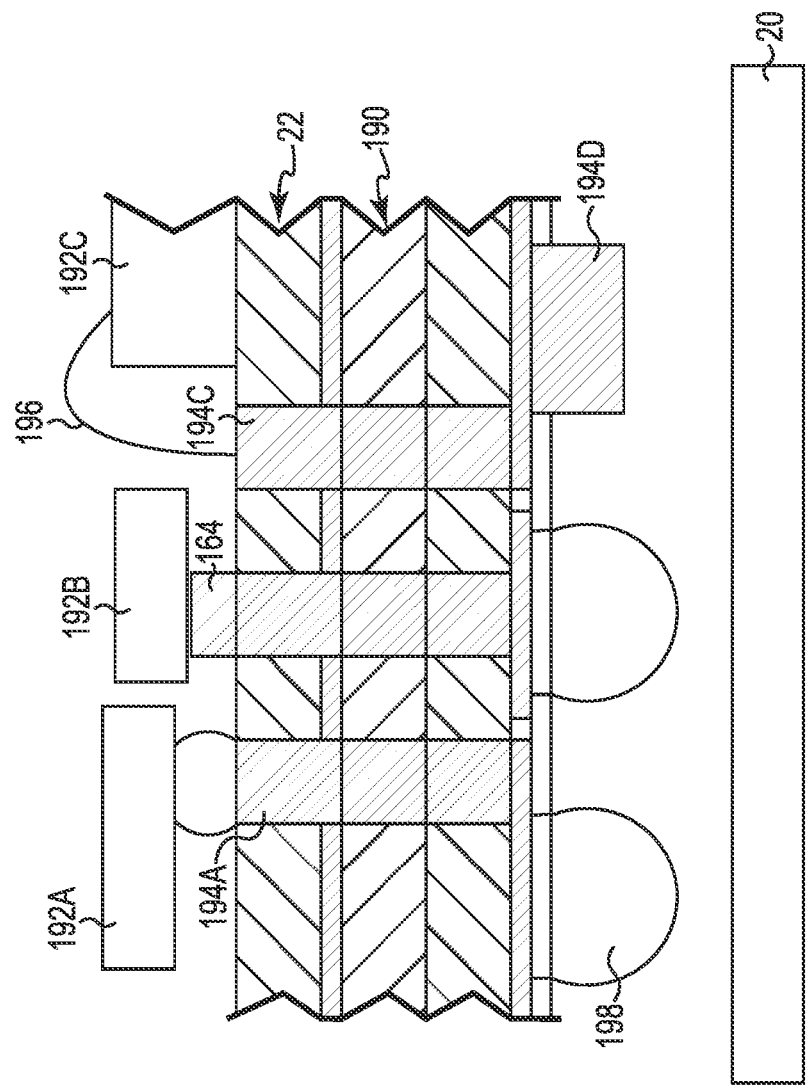
FIG. 13 illustrates an electrical interconnect for an IC package in accordance with an embodiment of the present disclosure.

FIG. 13 illustrates an electrical circuit 22 for semiconductor packaging applications in accordance with an embodiment of the present disclosure. The stack 190 can be final processed with a variety of options to facilitate electrical connections to IC devices 192A, 192B, 192C and to system level attachment to PCB 20.

In one embodiment, the plating 194A is planarized to facilitate flip chip attach to the structure directly (see e.g., FIG. 2) or to receive BGA device 192A. In other embodiment, plating 194B is extended to facilitate direct soldering of IC device die 192B with paste. In yet another embodiment, plating 194C is wire bonded 196 to the IC device 192C.

The low density main core 20 can be processed to accept a traditional ball grid array attachment 198 for an area array configuration or plated with solder/tin etc. for a no lead peripheral termination. The low density main core 20 can also be fashioned to have plating or post extensions 194D to facilitate direct solder attach with paste and provide a natural standoff from the PCB 20.

Figure 14:
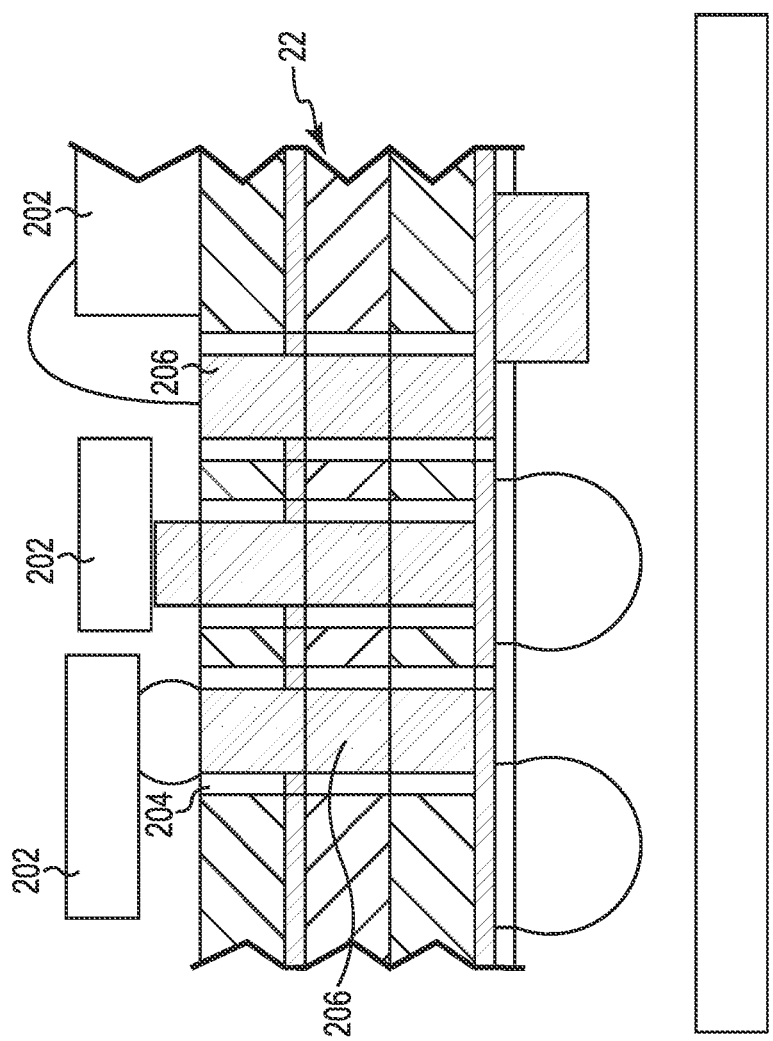
FIG. 14 illustrates an alternate electrical circuit for an IC package in accordance with an embodiment of the present disclosure.

FIG. 14 illustrates an electrical circuit 22 for a semiconductor packages 202 with dielectric materials 204 surrounding the conductive structures 206 in accordance with an embodiment of the present disclosure. Internal circuits and terminations may also be added by imaging or drilling the core material with a larger opening than needed and filling those openings with liquid dielectric and imaging the desired geometry to facilitate conductive structure formation.

Figure 15:
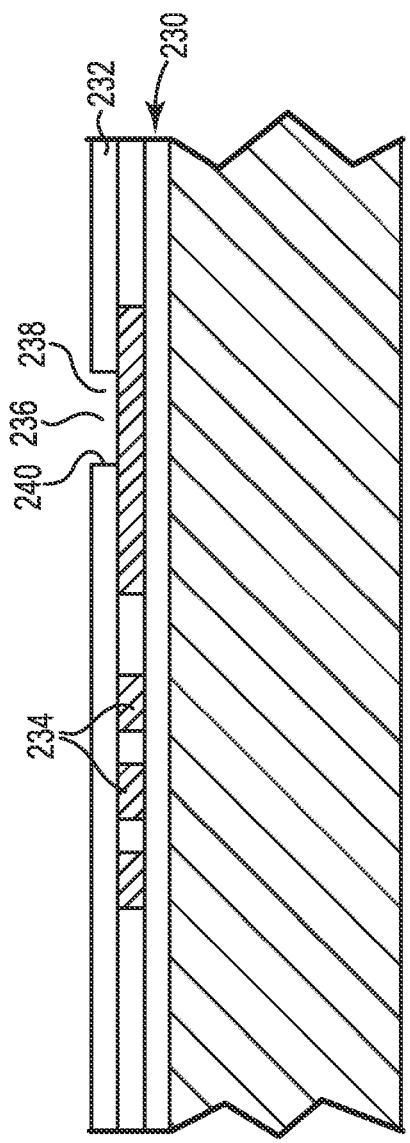
FIG. 15 is a side sectional view of an electrical circuit in accordance with an embodiment of the present disclosure.

FIG. 15 illustrates an alternate electrical circuit 230 with an insulating layer 232 applied to the circuit geometry 234. The nature of the application and imaging of the liquid dielectric layer 232 leaves selected portions 236 of the circuit geometry 234 expose if desired. The resulting high density electrical circuit 230 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will values in the range of 10' to 10" Ohm-meters.

Figure 16:
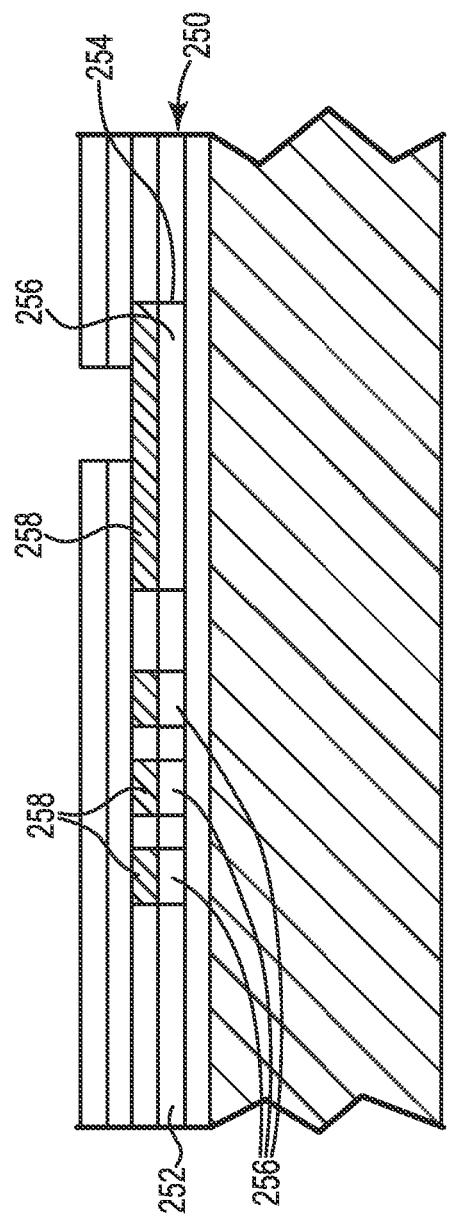
FIG. 16 is a side sectional view of an alternate electrical circuit with compliant material in accordance with an embodiment of the present disclosure.

FIG. 16 illustrates an alternate high density electrical circuit 250 in accordance with an embodiment of the present disclosure. Liquid dielectric layer 252 is imaged to include openings 254 into which compliant material 256 is deposited before formation of circuit geometry 258. The compliant material 256 improves reliability during flexure of the electrical circuit 250.

Figure 17:
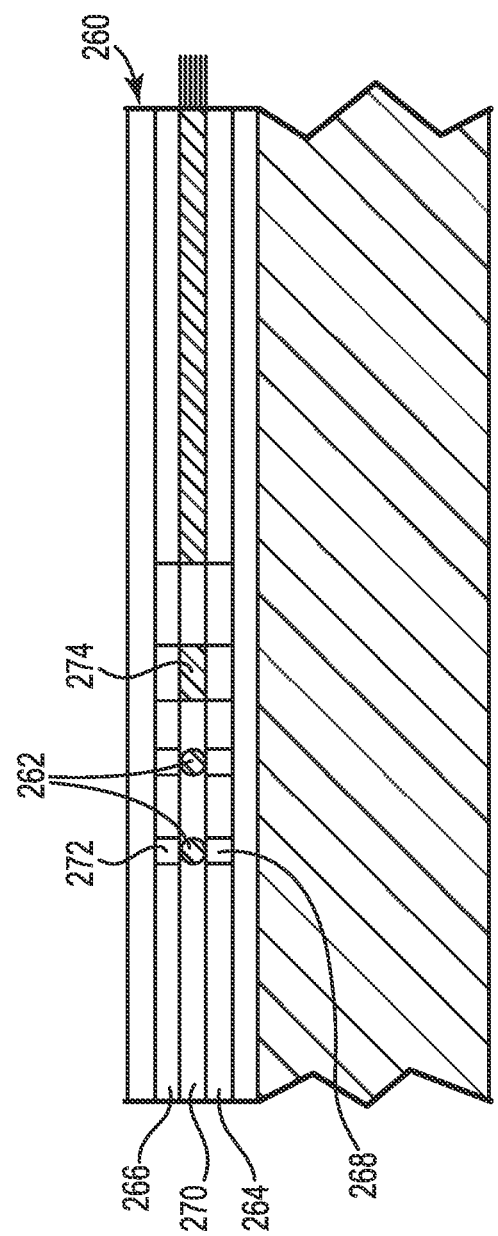
FIG. 17 illustrates an electrical circuit with optical features in accordance with an embodiment of the present disclosure.

FIG. 17 illustrates an alternate high density electrical circuit 260 in accordance with an embodiment of the present disclosure. Optical fibers 262 are located between layers 264, 266 of dielectric material. In one embodiment, optical fibers 262 are positioned over compliant layer 268, and dielectric layer 270 is deposited over and around the optical fibers 262. A compliant layer 272 is preferably applied above the optical fiber 262 as well. The compliant layers 268, 272 support the optical fibers 262 during flexure. In another embodiment, the dielectric layer 270 is formed or printed with recesses into which the optical fibers 262 are deposited.

In another embodiment, optical quality materials 274 are deposited during formation of the high density electrical circuit 260. The optical quality material 274 and/or the optical fibers 262 comprise optical circuit geometries. The metalization process allows for deposition of coatings in-situ that enhances the optical transmission or reduces loss. The precision of the metalization process reduces misalignment issues when the optical materials 274 are optically coupled with another optical structure.

Figure 18:
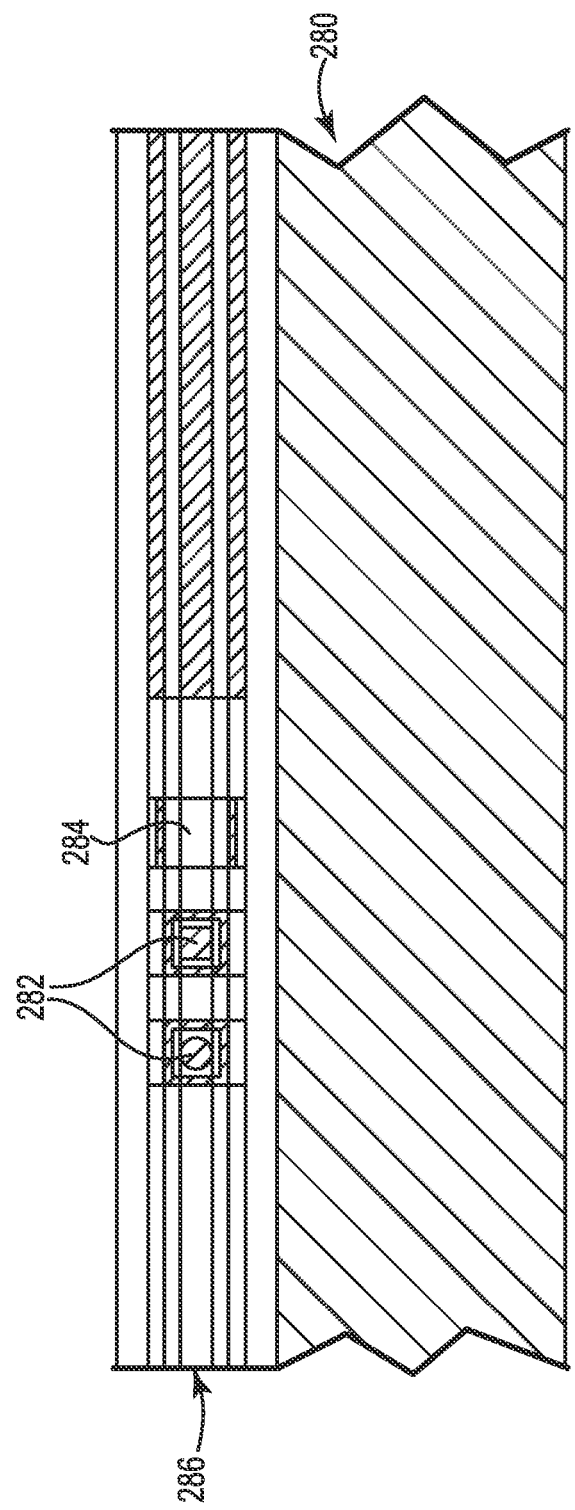
FIG. 18 illustrates an alternate high density electrical circuit with optical features in accordance with an embodiment of the present disclosure.

FIG. 18 illustrates another embodiment of a present high density electrical circuit 280 in accordance with an embodiment of the present disclosure. Embedded coaxial RF circuits 282 or printed micro strip RF circuits 284 are located with dielectric/metal layers 286. These RF circuits 282, 284 are preferably created by imaged liquid dielectrics and metallization geometry.

Figure 19:
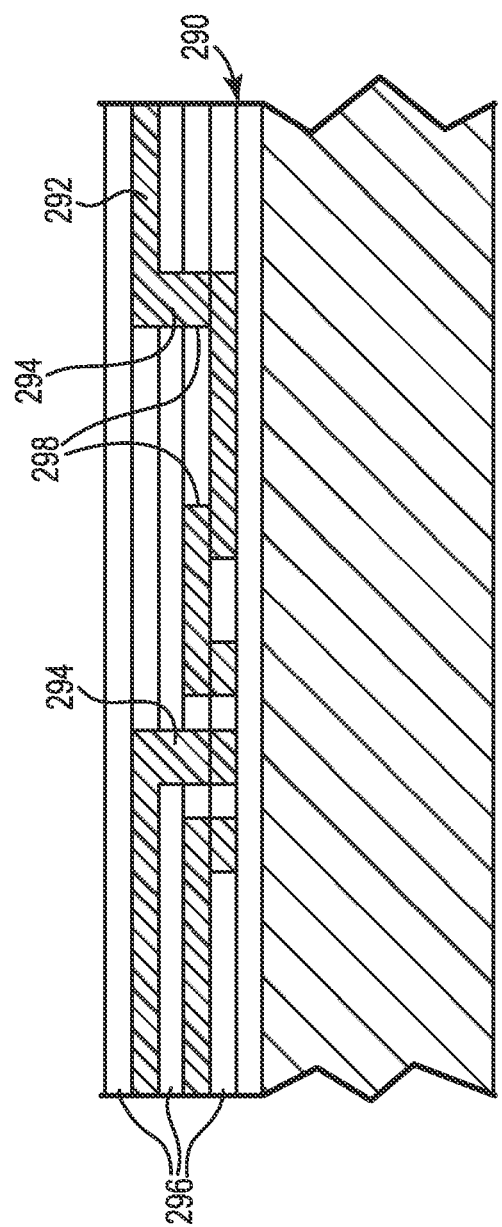
FIG. 19 illustrates an alternate high density circuit structure with vias in accordance with an embodiment of the present disclosure.

As illustrated in FIG. 19, use of deposition processes allows the creation of a high density electrical circuit 290 with inter-circuit, 3D lattice structures 292 having intricate routing schemes. Conductive pillars 294 can be printed with each layer, without drilling.

The application and imaging of the liquid dielectric layers 296 creates recesses 298 that control the location, cross section, material content, and aspect ratio of the conductive traces 292 and the conductive pillars 294. Maintaining the greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 298 to control the aspect ratio of the conductive traces 292 and the conductive pillars 294 results in a more rectangular or square cross-section, with the corresponding improvement in signal integrity.

In another embodiment, pre-patterned or pre-etched thin conductive foil circuit traces are transferred to the recesses 298. For example, a pressure sensitive adhesive can be used to retain the copper foil circuit traces in the recesses 298. The trapezoidal cross-sections of the pre-formed conductive foil traces are then post-plated. The plating material fills the open spaces in the recesses 298 not occupied by the foil circuit geometry, resulting in a substantially rectangular or square cross-sectional shape corresponding to the shape of the recesses 298.

In another embodiment, a thin conductive foil is pressed into the recesses 298, and the edges of the recesses 298 acts to cut or shear the conductive foil. The process locates a portion of the conductive foil in the recesses 298, but leaves the negative pattern of the conductive foil not wanted outside and above the recesses 298 for easy removal. Again, the foil in the recesses 298 is preferably post plated to add material to increase the thickness of the conductive traces 292 in the circuit geometry and to fill any voids left between the conductive foil and the recesses 298.

Figure 20:
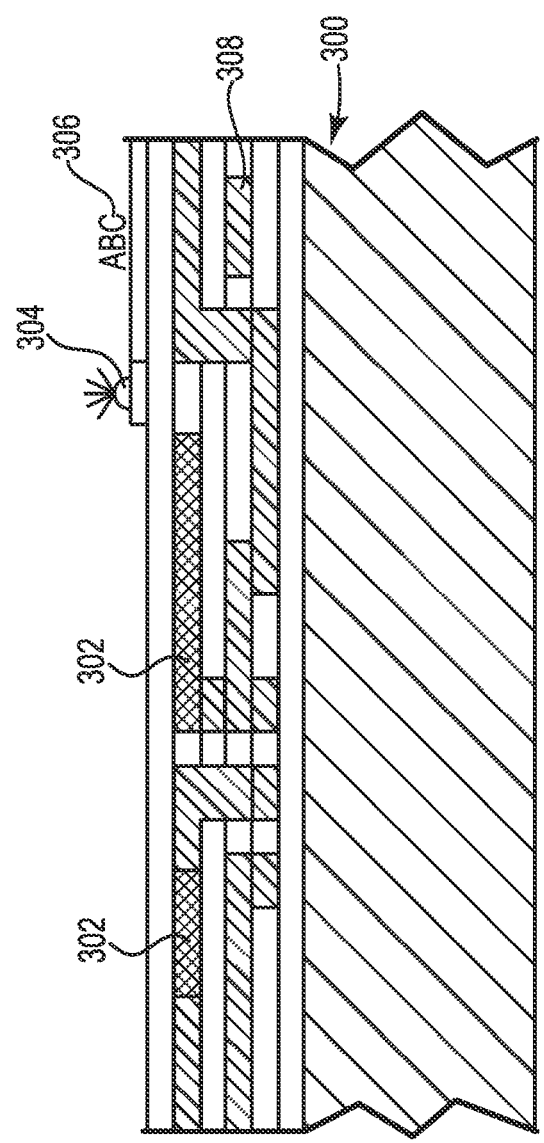
FIG. 20 illustrates an alternate high density circuit structure with printed electrical devices in accordance with an embodiment of the present disclosure.

FIG. 20 illustrates a high density electrical circuit 300 with printed electrical devices 302. The electrical devices 302 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 302 include printed LED indicator 304 and display electronics 306. Geometries can also be printed to provide capacitive coupling 308. Compliant material can be added between circuit geometry, such as discussed above, so the present electrical circuit compliance within the connector.

The electrical devices 302 are preferably printed during construction of the circuit assembly 300. The electrical devices 302 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 302 can be formed using printing technology, adding intelligence to the high density electrical circuit 300. Features that are typically located on other circuit members can be incorporated into the circuit 300 in accordance with an embodiment of the present disclosure.

The availability of printable silicon inks provides the ability to print electrical devices 302, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 302 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylerie. The materials provided above for forming the substrate, the dielectric layer, the electrodes, or the semiconductor layer are exemplary only. Other suitable materials known to those skilled in the art having properties similar to those described above can be used in accordance with the present disclosure.

The ink jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 21:
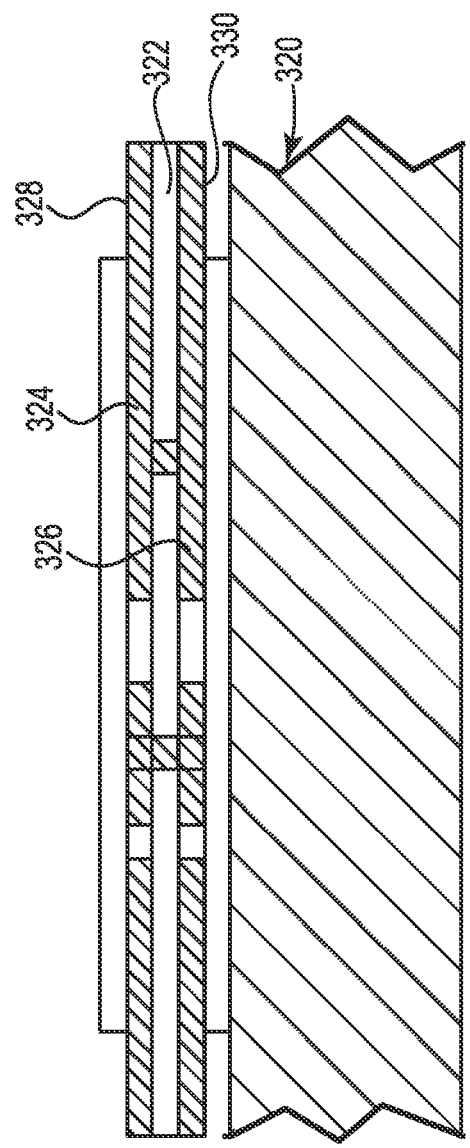
FIG. 21 illustrates an alternate high density electrical circuit with compliant electrical pads to plug into another connector in accordance with an embodiment of the present disclosure.

FIG. 21 illustrates an alternate high density electrical circuit 320 with compliant material 322 added between circuit geometries 324, 326 to facilitate insertion of exposed circuit geometries 328, 330 into a receptacle or socket. The liquid dielectric is typically imaged to create the recesses that receive the compliant material 322. The compliant material 322 can supplement or replace the compliance in the receptacle or socket. In one embodiment the compliance is provided by a combination of the compliant material 322 and the exposed circuit geometries 328, 330.

Figure 22:
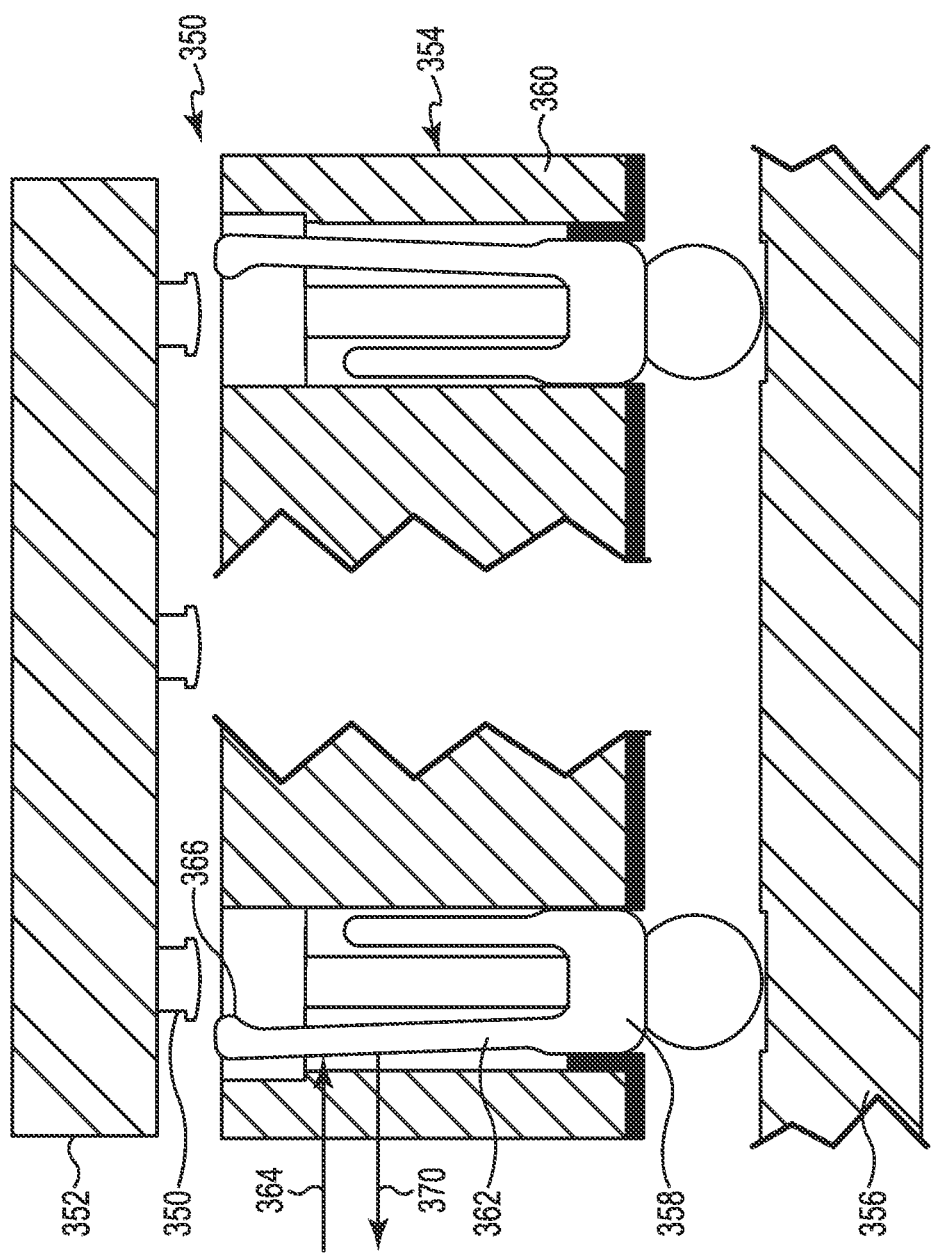
FIG. 22 illustrates an alternate high density electrical circuit with integral terminals in accordance with an embodiment of the present disclosure.

FIG. 22 illustrates an alternate high density electrical circuit with integral terminals 350 in accordance with an embodiment of the present disclosure. The integral terminals 350 are grown directly in first circuit member 352 as discussed herein. The, first circuit member 352 may be a semiconductor package substrate. printed circuit member, a flexible circuit, a socket housing, or the like.

In the illustrated embodiment, mating connector 354 is an interconnect to second circuit member 356, such as a PCB. Planar contacts 358 are etched in place within interconnect housing 360 or formed separately and assembled into connector housing 360. The contacts 358 include one or more beams 362 that are permitted to flex within the housing 360.

In the illustrated embodiment, protrusion 366 at distal ends of the beams 362 are configured to engage with the terminals 350, causing the beams 362 to flex outward in direction 370. Once the first circuit member 452 is fully engaged with the connector 454, the protrusions 366 are biased into engagement with undercuts 368 on the integral terminals 350 by bias force 364. In one embodiment, the bias force 364 retains the circuit member 352 to the connector housing 360. An external fixation mechanism may also be used to secure the first circuit member 352 to the housing 360.

Figure 23:
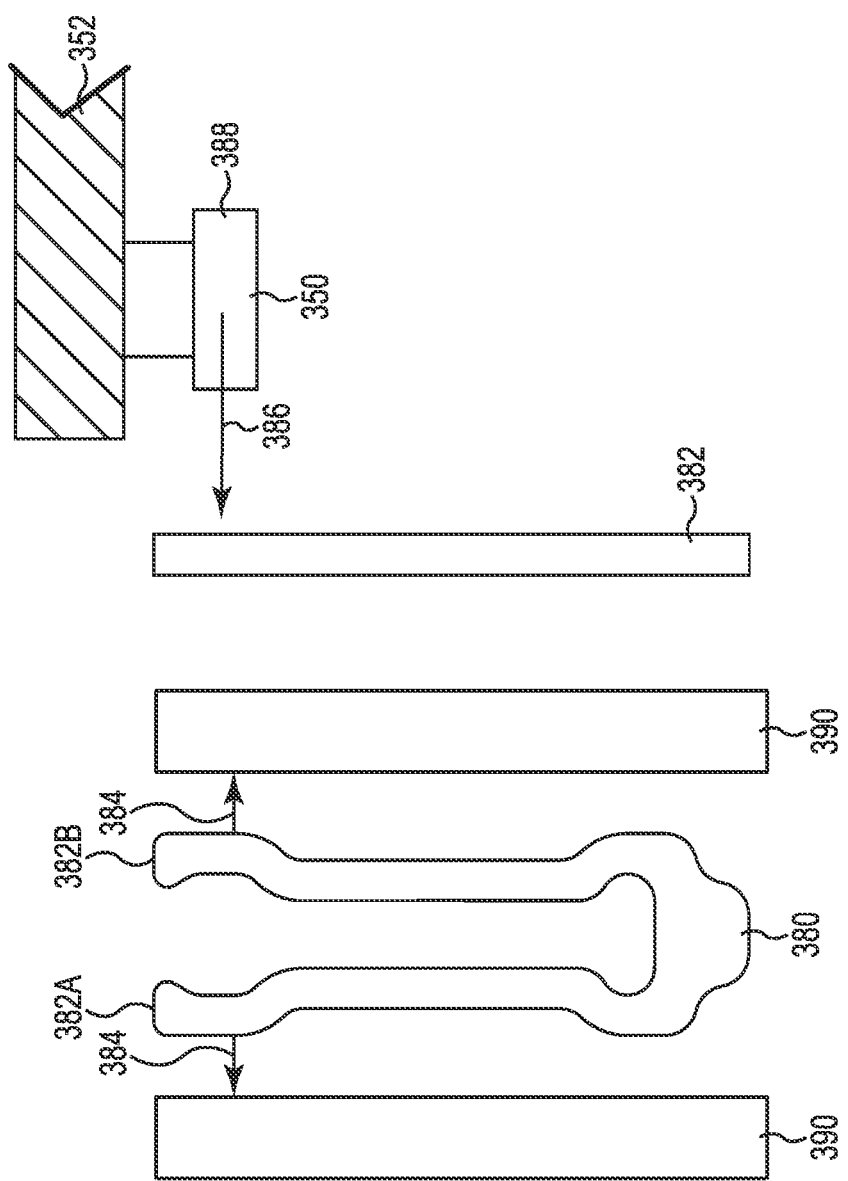
FIG. 23 illustrates an embodiment for forming a snap-fit coupling with the integral terminals, in accordance with an embodiment of the present disclosure.

FIG. 23 illustrates an embodiment for forming a snap-fit coupling with the integral terminals 350 in accordance with an embodiment of the present disclosure. Vertical contacts 380 include a pair of opposing beams 382A, 382B that flex outward 384 as integral terminals 350 are brought into engagement in direction 386. Distal portions 388 of the terminals 350 preferably have a circular cross sectional shape that facilitates engagement.

The circuit member 352 is moved in the direction 386 until it engages with connector housing 390. In one embodiment, space 392 between the connector housing 390 and the integral contact 350 is slightly greater than radius of the distal portion 388 of the contact 350 so the beams 382 are continually biases against the contact 350. In another embodiment, once the terminals 350 are in the space 392, the beams 382 close to form a snap-fit engagement with the terminals 350.

Figure 24:
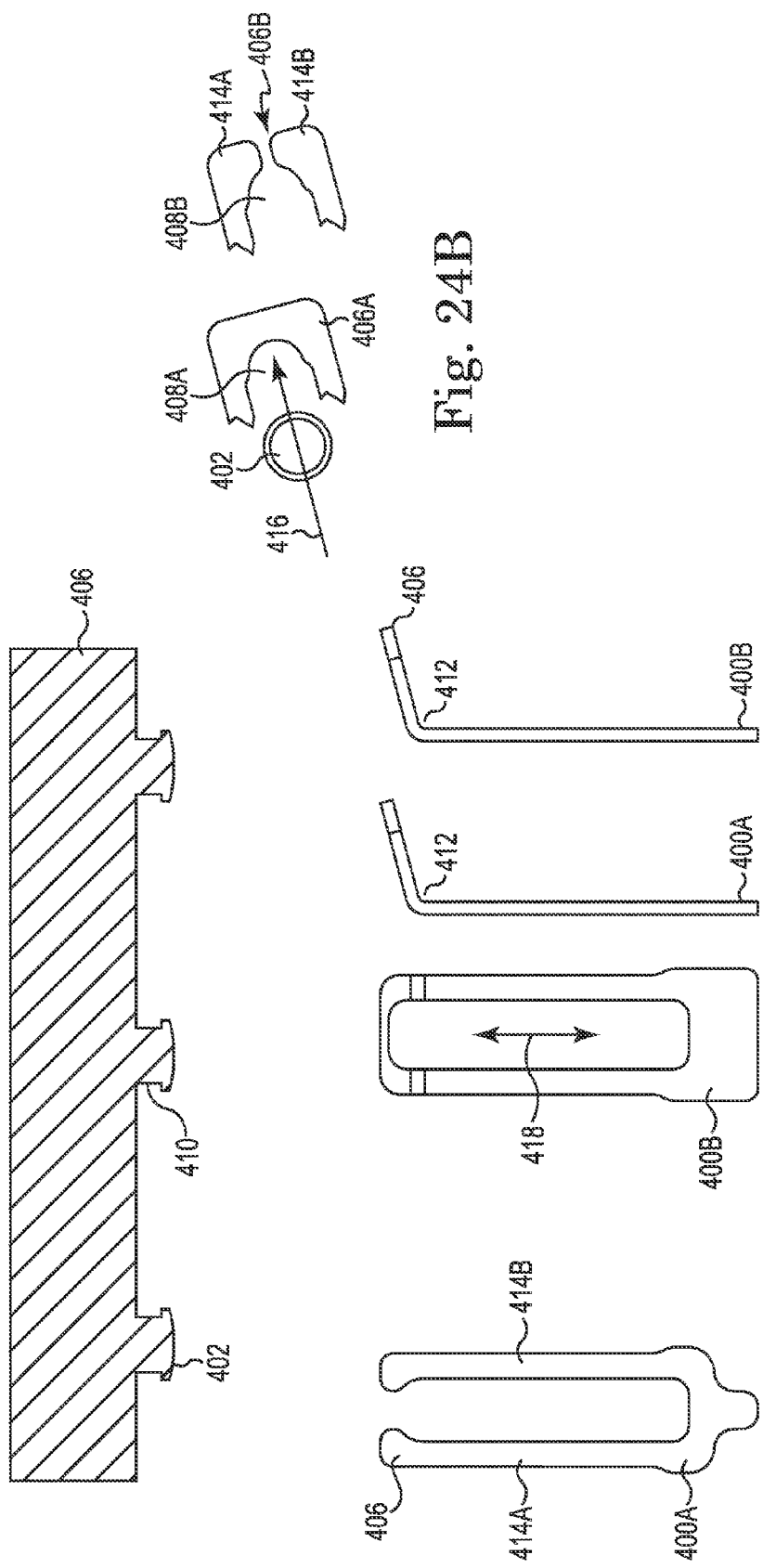

FIGS. 24A and 24B illustrate alternate engagement mechanisms between contact members 400A, 400B ("400") and integral terminals 402 on first circuit member 404 in accordance with an embodiment of the present disclosure. Distal portions 406A, 406B ("406") of the contacts members 400 are configured to ("408") have shapes complementary to neck portions 410 of the terminals 402. In one embodiment, distal portion 406B of contact member 400B is formed from two discrete beams 414A, 414B that can flex outward during engagement with the terminals 402.

Bends 412 near the distal portions 406 permit the terminals 402 to slide into engagement along axis 416 that is generally perpendicular to primary axis 418 of the contact members 400. Lateral or biasing loads can optionally be provided for low insertion force applications. An external mechanism can be used to maintain contact load 416 or engagement between the terminals 402 and the contact members 400 such that the terminals 402 are held by the contacts 400.

In another embodiment, the terminals 402 are forced into engagement with the contact members 400 with a lateral or biasing load 416 in a zero Insertion force mechanism with an external feature maintaining contact load 416 against the contact members 400 in a normally open environment, or the mechanism releases pre-loaded contact members 400 such that they engage with the terminals 402 in a normally closed environment. The terminals 402 can be installed and engaged in an environment containing each of the loading mechanisms described (normal force snap retention, LIF, ZIF etc.).

FIG. 25 illustrates an embodiment in which terminals 420 are soldered to PCB 422 in accordance with an embodiment of the present disclosure. Solder 424 wicks around the terminals 420 during reflow and engages with undercuts 426 to create an extremely strong joint. The present integral terminals 420 with undercuts 426 creates a joint much stronger than the conventional BGA solder ball BGA solder ball joints often require under fill to survive thermal or mechanical shock, not required in the illustrated embodiment because the integral terminals 420 provide a natural controlled height standoff 428. The neck region 426 of the terminals 420 provides a natural level of compliance as the ductile copper can provide some level of decoupling between the terminal 420, the circuit member 430 (such as an IC package) and the system board 422 to reduce the failure effects of thermal expansion coefficient disparities as well as mechanical stress of shock.

FIG. 26 illustrates a solder deposit 450 on the terminals 452 in accordance with an embodiment of the present disclosure. In the illustrated embodiment, the terminals 452 are tin plated and are capped with solder 450 in a popular for high pin count area array devices as an alternative to flip chip or C4 attachment. The advantage of the present approach is that flip chip and C4 attachments are limited in pitch due to the potential for solder bridging of conventional solder balls as the spacing between them during reflow is reduced.

The terminal deposition technique can also be enhanced to create the center conductor for a RF or SMA style coaxial connector, with the dielectric spacer and grounded shroud components added as a discrete component or assembly. The terminal deposition technique can also be enhanced to create the center conductor for a RF or SMA style coaxial connector, with the dielectric spacer and grounded shroud components constructed with an in-situ molded process, with the grounding shield features selectively metalized to the desired portions of the molded polymer. Embodiments of this method are disclosed in commonly assigned PCT application entitled SEMICONDUCTOR SOCKET WITH DIRECT SELECTIVE METALIZATION PCT/US13/31395, filed on the same date herewith, which is hereby incorporated by reference.

Where a range of values is provided, it is understood that each intervening value, to the tenth of the unit of the lower limit unless the context clearly dictates otherwise, between the upper and lower limit of that stated range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either or both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public the claims.

The invention claimed is:

1. A circuit assembly comprising:
   an array of integral terminals plated on a first circuit member comprising an electro-lessly plated shell with an electro-plated core. the integral terminals including at least one undercut;
   a printed circuit board with a plurality of recesses configured to receive the integral terminals; and a plurality of contact members electrically coupled with circuitry on a major surface of the printed circuit board and extending into a recesses generally parallel to the major surface;

wherein insertion of the integral terminals on the first circuit member into the recesses on the PCB is a zero or low insertion force process, such that shifting the first circuit member relative to the printed circuit board generally parallel to the major surface electrically couples the contact members with the undercuts on the integral terminals.

2. The circuit assembly of claim 1 wherein the integral terminal comprise a non-cylindrical shape.

3. The circuit assembly of claim 1 wherein the integral terminals comprise a plurality of discrete contact surfaces configured to electrically couple with the contact members on the PCB.

4. The circuit assembly of claim 1 wherein the recesses comprise exposed portions with cross-sectional shapes greater than cross-sectional shapes of the contact members.

5. The circuit assembly of claim 1 wherein the integral terminals comprise a narrow portions and the contact members comprise arms that mechanically couple with the narrow portions on the integral terminals.

6. The circuit assembly of claim 1 wherein the integral terminals comprise a narrow portions and the contact members comprise curvilinear arms that flex to receive the narrow portions on the integral terminals.

7. The circuit assembly of claim 1 wherein the contact members, comprise arms that extend around at least 150 degrees of the integral terminals.

8. The circuit assembly of claim 1 wherein the contact members comprise arms that contact at least two sides of the integral terminals.

9. The circuit assembly of claim 1 wherein the first circuit member comprises a package for an IC device or a socket for an IC device.

10. A method of making an array of integral terminals on a circuit assembly comprising the steps of:

depositing at least a liquid first dielectric layer on the first surface of a first circuit member. imaged to include a plurality of first recesses corresponding to the array of integral terminals;

processing selected surfaces of the first recesses to accept electro-less conductive plating deposition;

electro-lessly plating the selected surfaces of the first recesses to create a plurality of first conductive structures electrically coupled to, and extending generally perpendicular to, the first circuitry layer;

electro-plating the electro-less plating to substantially first recesses with a conductive material;

repeating the depositing, processing, electro-less plating, and electro-plating steps to form the integral terminals including at least one undercut;

removing the dielectric layers to expose the integral terminals;

preparing a printed circuit board with a plurality of recesses configured to receive the integral terminals;

positioning a plurality of contact members that are electrically coupled with circuitry on a first major surface of the printed circuit board and extend into the recesses generally parallel to the major surface;

inserting the integral terminals on the first circuit member into the recesses of the printed circuit board; and shifting the first circuit member relative to the printed circuit board generally parallel to the major surface to electrically couple the contact members with the undercuts on the integral terminals.

11. The method of claim 10 wherein the exposed terminal comprise a non-cylindrical shape.

12. The method of claim 10 wherein the integral terminals comprise a plurality of discrete contact surfaces.

13. The method of claim 10 comprising forming the recesses with exposed portions with cross-sectional shapes greater than cross-sectional shapes of the contact members so insertion of the integral terminals on the first circuit member into the recesses on the PCB is a zero or low insertion force process.

14. The method of claim 10 comprising electrically coupling multiple surfaces on the exposed terminal with the contact members on the PCB.

15. The method of claim 10 wherein the integral terminals comprise a narrow portions, the method comprising mechanically coupling arms on the contact members with the narrow portions on the integral terminals.

16. The method of claim 10 wherein the integral terminals comprise a narrow portions, the method comprising electrically coupling the contact members with the narrow portions on the integral terminals.

17. The method of claim 10 wherein the contact members comprise arms and the method comprises extending the arms around, at least 150 degrees of the integral terminals.

18. The method of claim 10 wherein the contact members comprise arms and the method comprises electrically coupling the arms with at least two locations on the integral terminals.

19. The method of claim 10 comprising the steps of:

filling the recesses in the, printed circuit board with a solder mask;

processing a circuitry layer on the printed circuit board including the contact members; and removing the solder mask from the recesses to leave the contact members in a cantilevered configuration with respect to the recesses.

* * * * *